(12) United States Patent
Liaw

(10) Patent No.: US 10,672,770 B2
(45) Date of Patent: Jun. 2, 2020

(54) SEMICONDUCTOR STRUCTURE

(71) Applicant: Taiwan Semiconductor Manufacturing Co., Ltd., Hsinchu (TW)

(72) Inventor: Jhon-Jhy Liaw, Zhudong Township, Hsinchu County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 16/128,783

(22) Filed: Sep. 12, 2018

(65) Prior Publication Data

US 2020/0058651 A1 Feb. 20, 2020

Related U.S. Application Data

(60) Provisional application No. 62/718,815, filed on Aug. 14, 2018.

(51) Int. Cl.
*H01L 27/092* (2006.01)
*H01L 27/11* (2006.01)
*H01L 23/532* (2006.01)
*H01L 29/78* (2006.01)
*H01L 29/423* (2006.01)
(Continued)

(52) U.S. Cl.
CPC .. *H01L 27/0924* (2013.01); *H01L 21/823821* (2013.01); *H01L 21/823892* (2013.01); *H01L 23/5226* (2013.01); *H01L 23/5329* (2013.01); *H01L 27/1104* (2013.01); *H01L 29/0847* (2013.01); *H01L 29/42356* (2013.01); *H01L 29/66545* (2013.01); *H01L 29/7851* (2013.01)

(58) Field of Classification Search
CPC ............ H01L 27/0924; H01L 27/1104; H01L 29/7851; H01L 29/42356; H01L 29/0847; H01L 29/66545; H01L 23/5329; H01L 23/5226; H01L 21/823892; H01L 21/823821
See application file for complete search history.

(56) References Cited

U.S. PATENT DOCUMENTS

| 2010/0025767 A1* | 2/2010 | Inaba | ................ H01L 29/41791 257/365 |
| 2011/0134684 A1* | 6/2011 | Marshall | ............... G11C 11/412 365/154 |

(Continued)

*Primary Examiner* — Sitaramarao S Yechuri
(74) *Attorney, Agent, or Firm* — Birch, Stewart, Kolasch & Birch, LLP

(57) ABSTRACT

Semiconductor structures are provided. A first source and drain region of a first transistor is electrically connected to a first conductive line through a first contact and a first via over the first contact. A first gate electrode of the first transistor is electrically connected to a second conductive line through a second contact and a second via over the second contact. A second source and drain region of a second transistor is electrically connected to a third conductive line through a third contact and a third via over the third contact. A second gate electrode of the second transistor is electrically connected to a fourth conductive line of the metal layer directly through a fourth via. Projections of the second via and the first channel region are separated on the substrate, and projections of the fourth via and the second channel region are overlapped on the substrate.

20 Claims, 17 Drawing Sheets

(51) Int. Cl.
*H01L 29/08* (2006.01)
*H01L 21/8238* (2006.01)
*H01L 23/522* (2006.01)
*H01L 29/66* (2006.01)

(56) References Cited

U.S. PATENT DOCUMENTS

| | | | |
|---|---|---|---|
| 2012/0012896 A1* | 1/2012 | Venkatraman | G11C 8/16 |
| | | | 257/206 |
| 2013/0181297 A1* | 7/2013 | Liaw | G11C 11/412 |
| | | | 257/390 |
| 2013/0292777 A1* | 11/2013 | Liaw | G11C 11/412 |
| | | | 257/369 |
| 2014/0077305 A1* | 3/2014 | Pethe | H01L 23/53257 |
| | | | 257/368 |
| 2014/0103450 A1* | 4/2014 | Cheng | H01L 21/845 |
| | | | 257/401 |
| 2019/0268000 A1* | 8/2019 | Song | H01L 29/4232 |

* cited by examiner

SEMICONDUCTOR STRUCTURE

CROSS REFERENCE TO RELATED APPLICATIONS

This Application claims priority of U.S. Provisional Application No. 62/718,815, filed on Aug. 14, 2018, the entirety of which is incorporated by reference herein.

BACKGROUND

Integrated circuits (ICs) have become increasingly important. Applications using ICs are used by millions of people. These applications include cell phones, smartphones, tablets, laptops, notebook computers, PDAs, wireless email terminals, MP3 audio and video players, and portable wireless web browsers. Integrated circuits increasingly include powerful and efficient on-board data storage and logic circuitry for signal control and processing.

Memories are commonly used in ICs. For example, a static random access memory (SRAM) is a volatile memory used in electronic applications where high speed, low power consumption, and simplicity of operation are needed. Embedded SRAM is particularly popular in high-speed communications, image processing, and system-on-chip (SOC) applications. SRAM has the advantage of being able to hold data without requiring a refresh.

The semiconductor industry has experienced rapid growth due to continuous improvements in the integration density of a variety of electronic components (e.g., memory cells and standard cells). Therefore, metal routing efficiency is important for decreasing the complexity of IC designs.

BRIEF DESCRIPTION OF THE DRAWINGS

Aspects of the present disclosure are best understood from the following detailed description when read with the accompanying figures. It should be noted that, in accordance with the standard practice in the industry, various nodes are not drawn to scale. In fact, the dimensions of the various nodes may be arbitrarily increased or reduced for clarity of discussion.

DETAILED DESCRIPTION

Figure 1A:
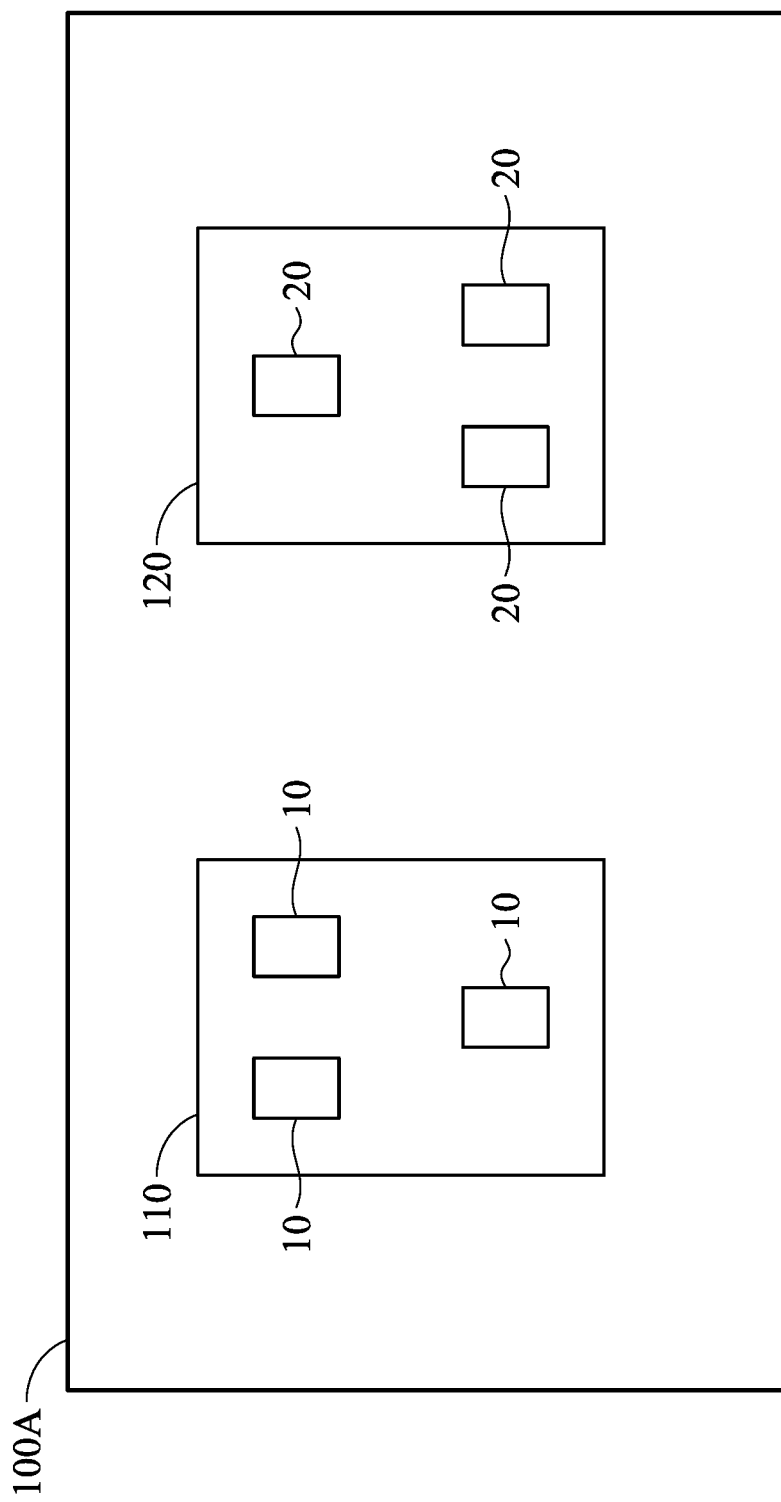
FIG. 1A is a simplified diagram of an IC, in accordance with some embodiments of the disclosure.

The following disclosure provides many different embodiments, or examples, for implementing different nodes of the subject matter provided. Specific examples of components and arrangements are described below to simplify the present disclosure. These are, of course, merely examples and are not intended to be limiting. In some embodiments, the formation of a first node over or on a second node in the description that follows may include embodiments in which the first and second nodes are formed in direct contact, and may also include embodiments in which additional nodes may be formed between the first and second nodes, such that the first and second nodes may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various semiconductor structures of integrated circuits (ICs) are provided in accordance with various exemplary embodiments. Some variations of some embodiments are discussed. Throughout the various views and illustrative embodiments, like reference numbers are used to designate like elements.

FIG. 1A is a simplified diagram of an IC 100A, in accordance with some embodiments of the disclosure. The IC 100A includes a first circuit 110 and a second circuit 120. In some embodiments, the first circuit 110 and the second circuit 120 are configured to perform the same/similar functions or operations. For example, the first circuit 110 and the second circuit 120 may be the controllers for various memories. In some embodiments, the first circuit 110 and the second circuit 120 are configured to perform the different functions or operations.

The first circuit 110 includes a plurality of logic cells 10. In some embodiments, the first logic cell 10 may be a standard cell. Furthermore, the logic functions of the logic cells 10 may be the same or different. For example, the logic cells 10 may be the standard cells corresponding to the same logic gates (e.g., INV, NAND, NOR logic gate and so on) or different logic gates. Similarly, the second circuit 120 includes a plurality of logic cells 20. In some embodiments, the second logic cell 20 may be a standard cell. Furthermore, the logic functions of the logic cells 20 may be the same or different. In some embodiments, the logic cells 10 and 20 corresponding to the same function or operation have the same circuit configuration with different semiconductor structures.

Figure 1B:
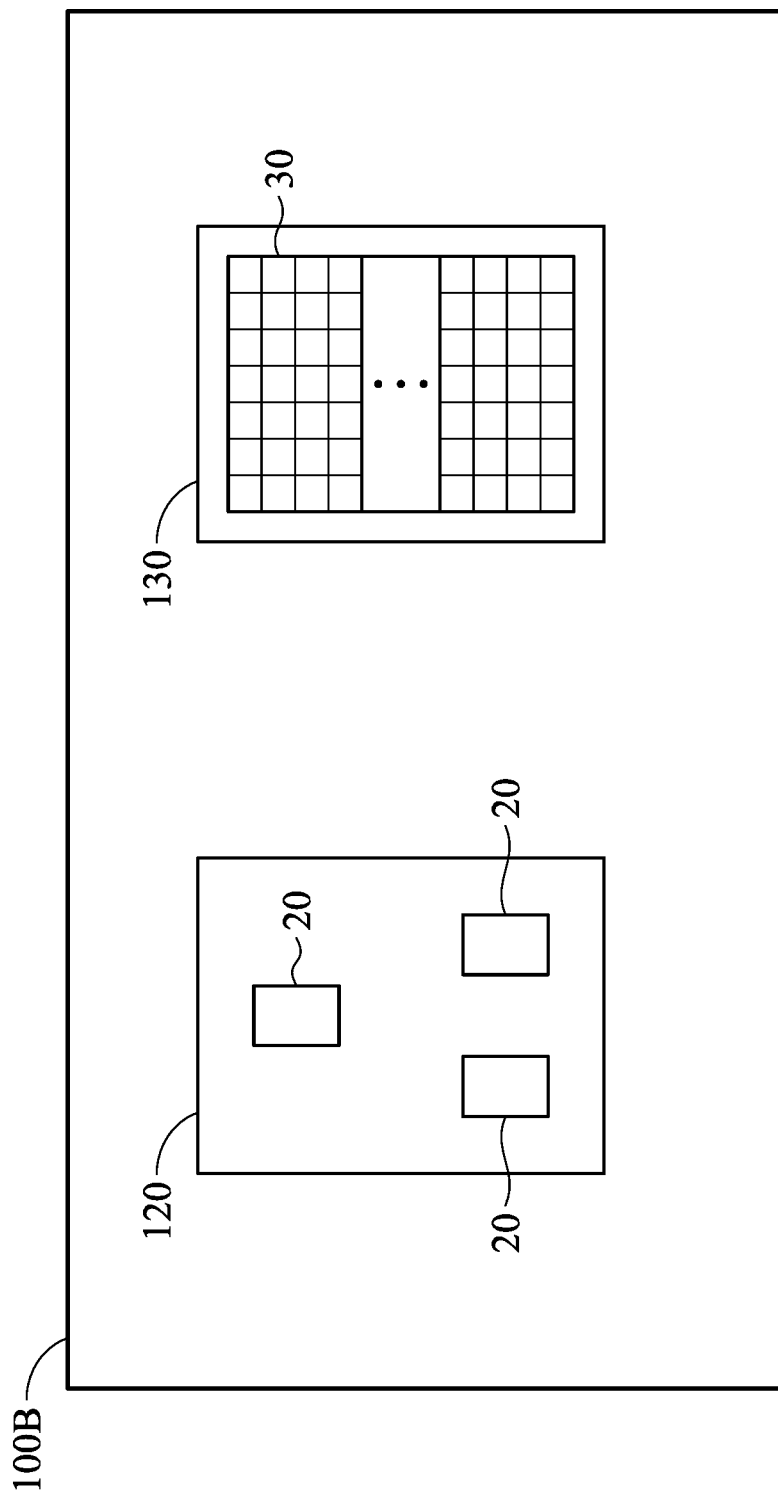
FIG. 1B is a simplified diagram of an IC, in accordance with some embodiments of the disclosure.

FIG. 1B is a simplified diagram of an IC 100B, in accordance with some embodiments of the disclosure. The IC 100B includes a second circuit 120 and a memory 130. In some embodiments, the second circuit 120 may be the controller for accessing the memory 130. As described above, the second circuit 120 includes a plurality of logic cells 20, and the logic functions of the logic cells 20 may be the same or different. The memory 130 includes a plurality of memory cells 30 arranged in rows and columns of a array. In some embodiments, the memory cells 30 have the same circuit configuration and the same semiconductor structure. In some embodiments, the memory cell 30 may be a bit cell of SRAM or DRAM.

Figure 1C:
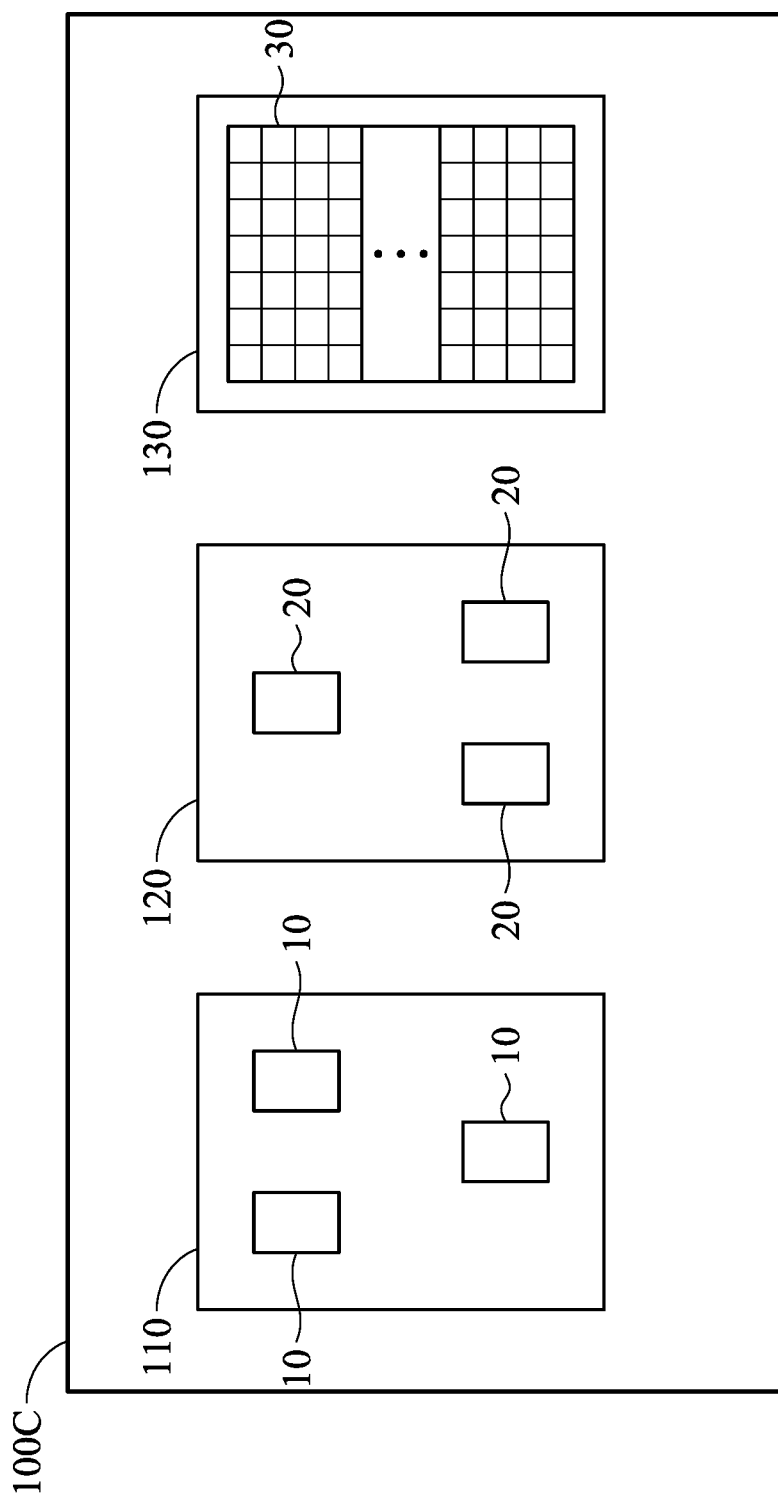
FIG. 1C is a simplified diagram of an IC, in accordance with some embodiments of the disclosure.

FIG. 1C is a simplified diagram of an IC 100C, in accordance with some embodiments of the disclosure. The IC 100C includes a first circuit 110, a second circuit 120 and a memory 130. In some embodiments, the first circuit 110 and the second circuit 120 are configured to perform the same/similar functions or operations. For example, the first circuit 110 and the second circuit 120 may be the controllers for accessing the one or more memories 130. In some embodiments, the first circuit 110 and the second circuit 120 are configured to perform the different functions or operations. As described above, the first circuit 110 includes a plurality of logic cells 10, and the logic functions of the logic cells 10 may be the same or different. Furthermore, the second circuit 120 includes a plurality of logic cells 20, and the logic functions of the logic cells 20 may be the same or different. Moreover, the memory 130 includes a plurality of memory cells 30 arranged in rows and columns of a array. In some embodiments, the memory cells 30 have the same circuit configuration and the same semiconductor structure. Furthermore, the logic cells 10 and 20 corresponding to the same function or operation have the same circuit configuration with different semiconductor structures.

Figure 2A:
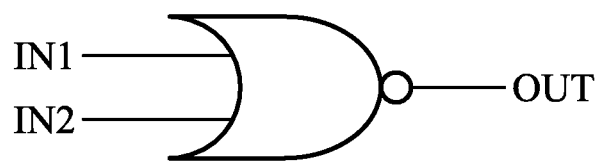
FIG. 2A illustrates a logic symbol of a standard cell.
Figure 2B:
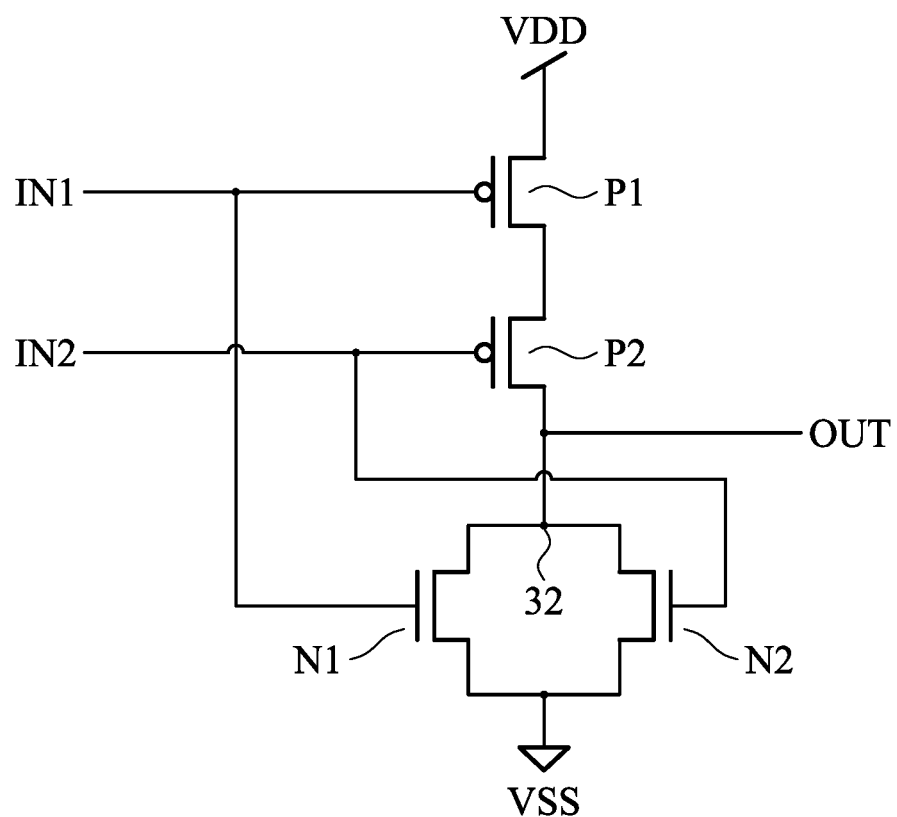
FIG. 2B is a circuit diagram of the standard cell in FIG. 2A.

FIG. 2A illustrates the logic symbol of a standard cell, and FIG. 2B is a circuit diagram of the standard cell in FIG. 2A. The standard cell in FIG. 2A is a NOR logic gate configured to provide an output signal OUT according two input signals IN1 and IN2. The NOR logic gate includes two PMOS transistors P1 and P2 and two NMOS transistors N1 and N2. The two PMOS transistors P1 and P2 and two NMOS transistors N1 and N2 may be planar MOS transistors or fin field effect transistors (FinFETs).

In the NOR logic gate, the PMOS transistor P1 is coupled between a power supply VDD and the PMOS transistor P2, and the PMOS transistor P2 is coupled between the PMOS transistor P1 and a node 32. The NMOS transistors N1 and N2 are coupled in parallel between the node 32 and a ground VSS. The input signal IN1 is input to the gates of the PMOS transistor P1 and the NMOS transistor N1, and the input signal IN2 is input to the gates of the PMOS transistor P2 and the NMOS transistor N2. Furthermore, the output signal OUT is provided at the node 32.

Figure 3:
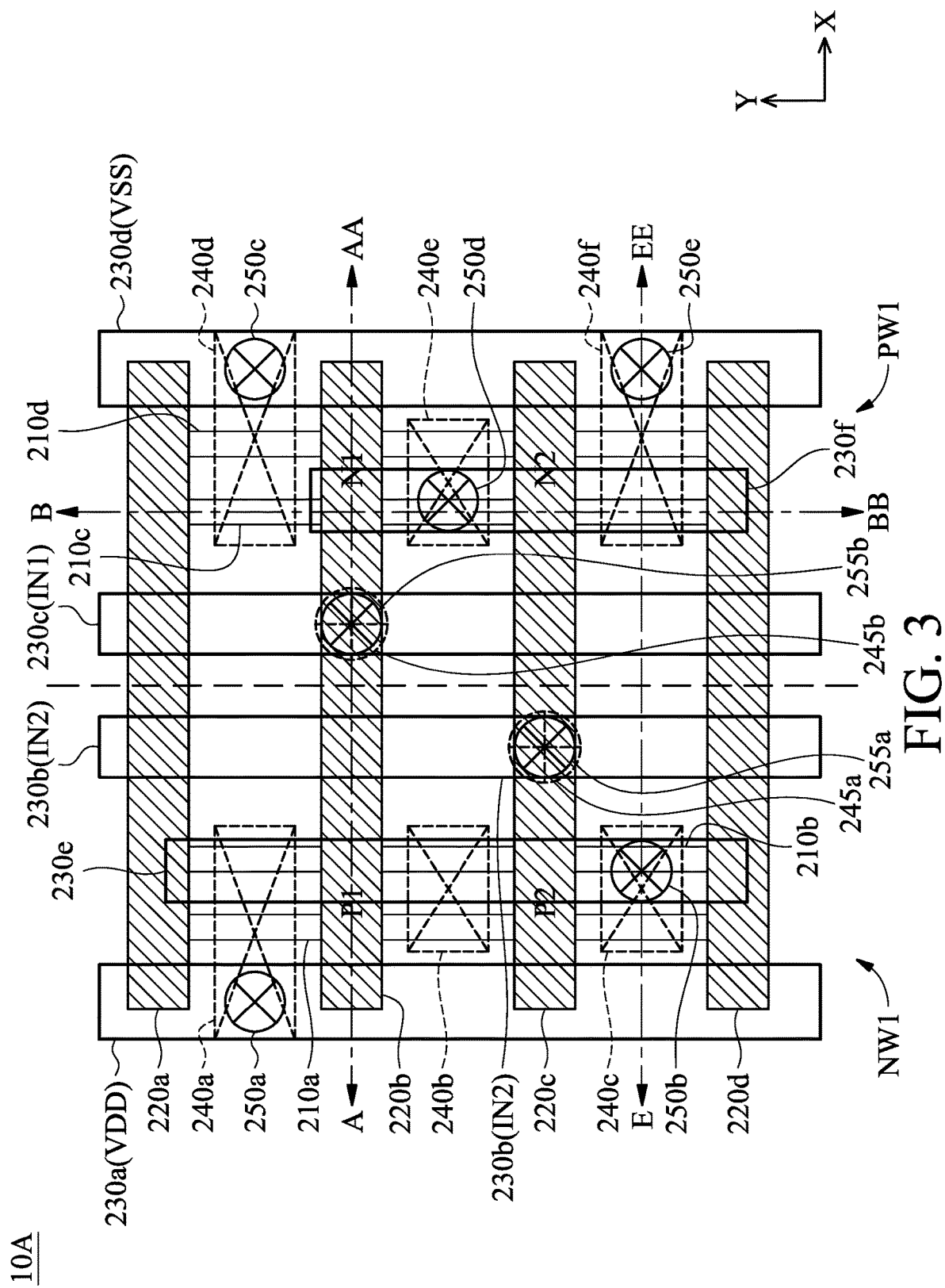
FIG. 3 illustrates the layout of the semiconductor structure of a first logic cell, in accordance with some embodiments of the disclosure.

FIG. 3 illustrates the layout of the semiconductor structure of a first logic cell 10A, in accordance with some embodiments of the disclosure. In FIG. 3, the NOR logic gate of FIGS. 2A and 2B is implemented in the first logic cell 10A, and the PMOS transistors P1 and P2 and the NMOS transistors N1 and N2 are dual-fin FETs.

In FIG. 3, the semiconductor fins 210a and 210b extending in the Y-direction are disposed over an N-type well region NW1, and the semiconductor fins 210c and 210d extending in the Y-direction are disposed over a P-type well region PW1. A gate electrode 220b extending in the X-direction forms the PMOS transistor P1 with an underlying active region formed by the semiconductor fins 210a and 210b over the N-type well region NW1. Furthermore, the gate electrode 220b forms the NMOS transistor N1 with an underlying active region formed by the semiconductor fins 210c and 210d in the P-type well region PW1. In other words, the gate electrode 220b is shared by the NMOS transistor N1 and the PMOS transistor P1. The gate electrode 220b is coupled to a conductive line 230c extending in the Y-direction through a gate contact 245b and a via 255b, and the conductive line 230c is configured to connect the gate electrode 220b to an overlying level for receiving the input signal IN1.

A gate electrode 220c extending in the X-direction forms the PMOS transistor P2 with an underlying active region formed by the semiconductor fins 210a and 210b over the N-type well region NW1. Furthermore, the gate electrode 220c forms the NMOS transistor N2 with an underlying active region formed by the semiconductor fins 210c and 210d in the P-type well region PW1. In other words, the gate electrode 220c is shared by the NMOS transistor N2 and the PMOS transistor P2. The gate electrode 220c is coupled to a conductive line 230b extending in the Y-direction through a gate contact 245a and a via 255a, and the conductive line 230b is configured to connect the gate electrode 220c to an overlying level for receiving the input signal IN2.

The gate electrodes 220a and 220d extending in the X-direction are dummy gate electrodes. The gate electrodes 220b and 220c are arranged between the gate electrodes 220a and 220d, and the NMOS transistors N1 and N2 and the PMOS transistors P1 and P2 are surrounded by the gate electrodes 220a and 220d.

In some embodiments, the structure of the gate electrodes 220a through 220d includes multiple material structure selected from a group consisting of poly gate/SiON structure, metals/high-K dielectric structure, Al/refractory metals/high-K dielectric structure, silicide/high-K dielectric structure, or a combination thereof.

A conductive line 230a extending in the Y-direction is coupled to the source region of the PMOS transistor P1 through the contact 240a and the via 250a, and the conductive line 230a is configured to connect the source region of the PMOS transistor P1 to an overlying level for coupling the power supply VDD.

A conductive line 230d extending in the Y-direction is coupled to the source region of the NMOS transistor N1 through the contact 240d and the via 250c and to the source region of the NMOS transistor N2 through the contact 240f and the via 250e. The conductive line 230d is configured to connect the source regions of the NMOS transistors N1 and N2 to an overlying level for coupling the ground VSS.

In some embodiments, each of the vias 250a through 250e and the vias 255a and 255b includes a metal plug made of the same material. In some embodiments, the material of the metal plug is purely W (Tungsten) or purely Ru (Ruthenium) without sidewall barrier layer. In some embodiments, the material of the metal plug is selected from a group consisting of Ti, TiN, TaN, Co, Ru, Pt, W, Al, Cu, or a combination thereof.

In some embodiments, each of the contacts 240a through 240f and the gate contacts 245a and 245b includes a metal plug made of the same material. In some embodiments, the material of the metal plug is selected from a group consisting of Ti, TiN, TaN, Co, Ru, Pt, W, Al, Cu, or a combination thereof.

In some embodiments, for the PMOS transistors P1 and P2 and the NMOS transistors N1 and N2, the contact 240a through 240f corresponding to the source/drain regions and the contacts 245a and 245b corresponding to the gate regions have different shapes in the layout. For example, contacts 240a through 240f are slot-shaped, and contacts 245a and 245b have a round shape.

In some embodiments, the source/drain regions of the PMOS transistor P1 and P2 are formed by the P-type doping region including epitaxy material. The epitaxy material is selected from a group consisting of SiGe, or SiGeC, or Ge, or Si, or a combination thereof.

In some embodiments, the source/drain regions of the NMOS transistor N1 and N2 are formed by the N-type doping region including epitaxy material. The epitaxy material is selected from a group consisting of SiP content, or SiC content, or SiPC, or Si, or a combination thereof.

Figure 4A:
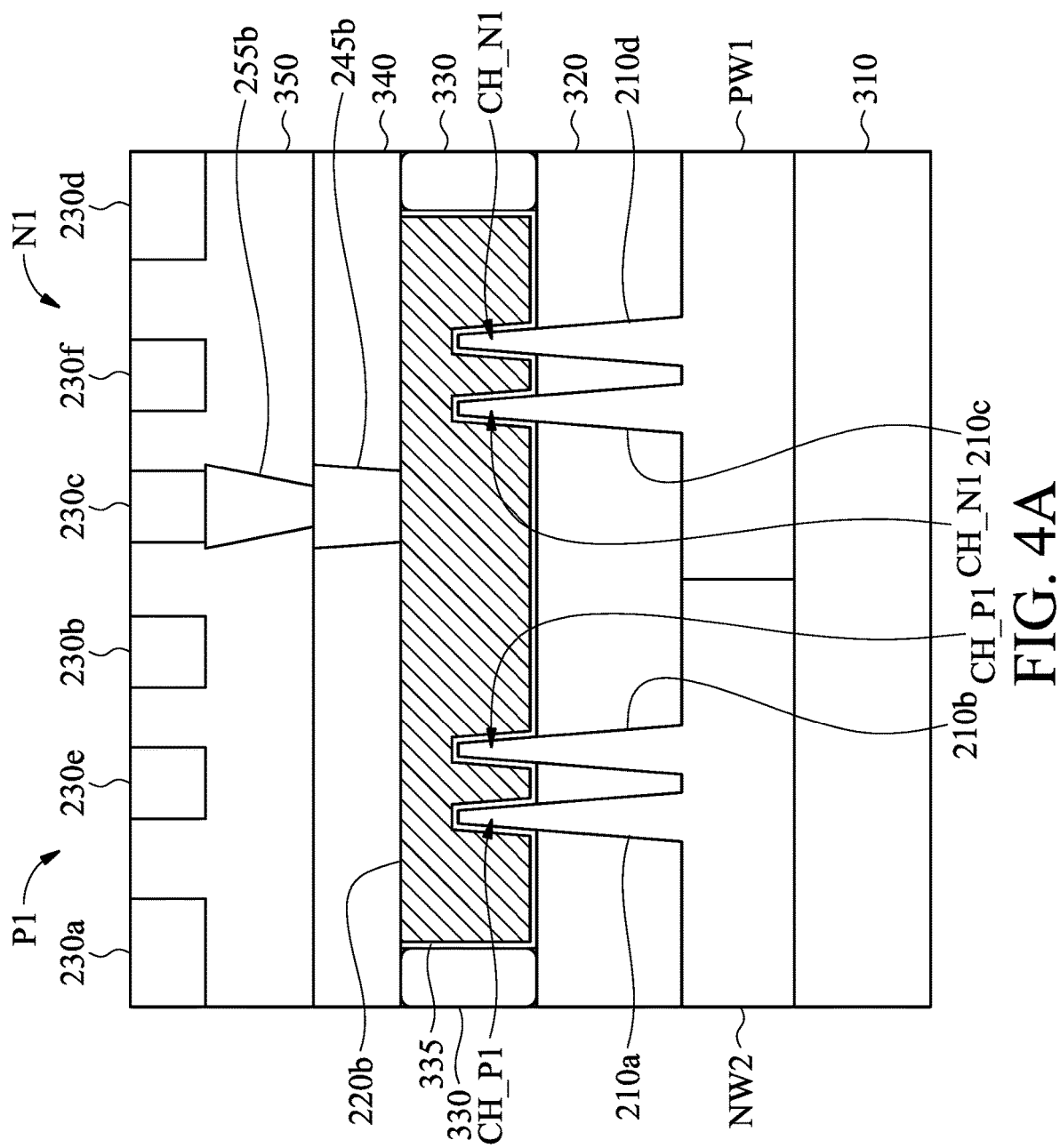
FIG. 4A illustrates a cross-sectional view of the semiconductor structure of the first logic cell along line A-AA in FIG. 3, in accordance with some embodiments of the disclosure.

FIG. 4A illustrates a cross-sectional view of the semiconductor structure of the first logic cell 10A along line A-AA in FIG. 3, in accordance with some embodiments of the disclosure. The P-type well region PW1 and the N-type well region NW1 are formed over a substrate 310. In some embodiments, the substrate 310 is a Si substrate. In some embodiments, the material of the substrate 310 is selected from a group consisting of bulk-Si, SiP, SiGe, SiC, SiPC, Ge, SOI-Si, SOI-SiGe, III-VI material, or a combination thereof.

The semiconductor fins 210a and 210b are formed on the N-type well region NW1. In some embodiments, the semiconductor fins 210a and 210b include an appropriate concentration of n-type dopants (e.g., phosphorous (such as 31P), arsenic, or a combination thereof). The semiconductor fins 210a and 210b are separated from each other by the shallow trench isolation (STI) 320.

The semiconductor fins 210c and 210d are formed on the P-type well region PW1. In some embodiments, the semiconductor fins 210c and 210d include an appropriate concentration of P-type dopants (e.g., boron (such as 11B), boron, boron fluorine ($BF_2$), or a combination thereof). Furthermore, the semiconductor fins 210c and 210d are separated from each other by the STI 320.

The gate electrode 220b is formed over the gate dielectrics 335 and is positioned over a top surface of the semiconductor fins 210a through 210d. Each of the semiconductor fins 210a and 210b overlapping the gate electrode 220b, may serve as a channel region CH_P1 of the PMOS transistor P1. Thus, the gate electrode 220b and the gate dielectrics 335 over the semiconductor fins 210a and 210b form a gate structure for the PMOS transistor P1. Furthermore, each of the semiconductor fins 210c and 210d overlapping the gate electrode 220b may serve as a channel region CH_N1 of the NMOS transistor N1. Thus, the gate electrode 220b and the gate dielectrics 335 over the semiconductor fins 210c and 210d form a gate structure for the NMOS transistor N1. In some embodiments, the spacers 330 are formed on opposite sides of the gate electrode 220b.

Inter-Layer Dielectric (ILD) layer 340 is formed over the gate electrode 220b and the spacer 330. The ILD layer 340 may be formed of an oxide such as Phospho-Silicate Glass (PSG), Boro-Silicate Glass (BSG), Boron-Doped Phospho-Silicate Glass (BPSG), Tetra Ethyl Ortho Silicate (TEOS) oxide, or the like.

The contact 245b is formed in the ILD layer 340. Furthermore, the contact 245b is disposed over the gate electrode 220b and does not overlap the semiconductor fins 210a through 210d. In other words, projection of the contact 245b does not overlap the projections of the semiconductor fins 210a through 210d on the substrate 310, i.e. the projections of the contact 245b and the semiconductor fins 210a through 210d are separated on the substrate 310.

Inter-metallization dielectric (IMD) layer 350 is formed over the ILD layer 340. The via 255b and the conductive lines 230a through 230f are formed in the IMD layer 350. In some embodiments, the conductive lines 230a through 230f are metal lines formed in the same metal layer. The gate electrode 220b is electrically connected to the conductive line 230c through the contact 245b and the via 255b, thus the gate regions of the PMOS transistor P1 and the NMOS transistor N1 are electrically connected to the conductive line 230c.

Figure 4B:
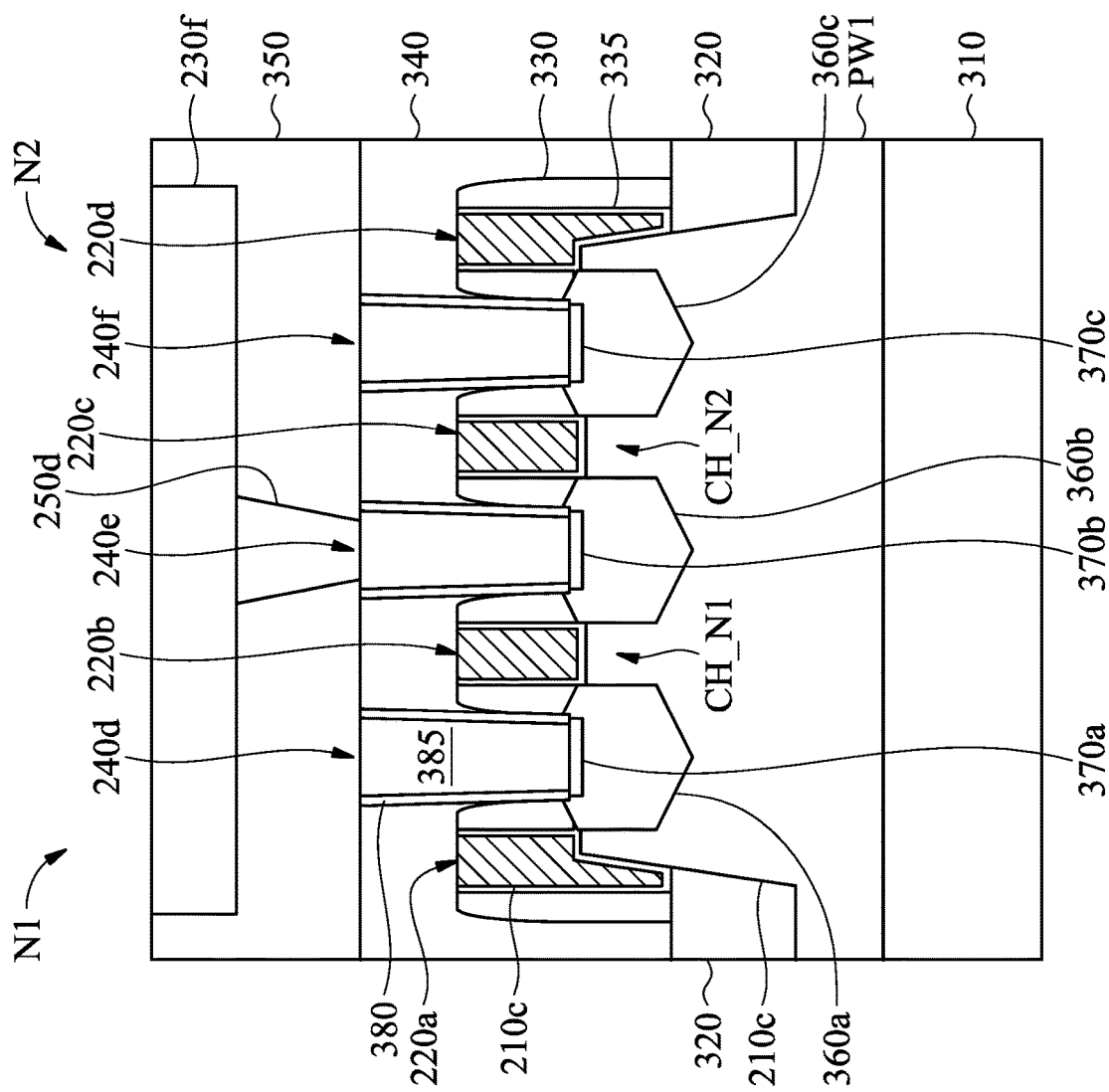
FIG. 4B illustrates a cross-sectional view of the semiconductor structure of the first logic cell along line B-BB in FIG. 3, in accordance with some embodiments of the disclosure.

FIG. 4B illustrates a cross-sectional view of the semiconductor structure of the first logic cell 10A along line B-BB in FIG. 3, in accordance with some embodiments of the disclosure. The P-type well region PW1 is formed over the substrate 310. The semiconductor fin 210c is formed on the P-type well region PW1, and is surrounded by the STI 320.

The ILD 340 is formed over the STI 320. The N-type doping regions 360a through 360c form the source/drain regions on the semiconductor fin 210c. The source/drain silicide regions 370a through 370c are formed on the N-type doping regions 360a through 360c, respectively. The contacts 240d through 240f are formed on the source/drain silicide regions 370a through 370c, respectively. Each of the contacts 240d through 240f includes a metal plug 385 and a high-K dielectric 380 formed on the sidewall of the metal plug 385. In other words, the metal plug 385 is surrounded by the high-K dielectric 380.

In some embodiments, the dielectric constant of the high-K dielectric 380 is greater than 4.9 or 5. In some embodiments, the thickness of the high-K dielectric 380 is within a range of 5 to 50 Å, where Å=$10^{-10}$ m. In some embodiments, the material of the high-K dielectric 380 is selected from a group consisting of a nitride-based dielectric, a metal oxide dielectric, Hf oxide ($HfO_2$), Ta oxide ($Ta_2O_5$), Ti oxide ($TiO_2$), Zr oxide ($ZrO_2$), Al oxide ($Al_2O_3$), Y oxide ($Y_2O_3$), or a combination thereof. In some embodiments, the material of the high-K dielectric 380 is selected from a group consisting of SiON, $Ta_2O_5$, $Al_2O_3$, a nitrogen-content oxide layer, nitrided oxide, a metal oxide dielectric, Hf-content oxide, Ta-content oxide, Ti-content oxide, Zr-content oxide, Al-content oxide, La-content oxide, or a combination thereof.

The via 250d and the conductive line 230f are formed in the ILD layer 350. The N-type doping region 360b is electrically connected to the conductive line 230f through the via 250d, the contact 240e and the source/drain silicide region 370b, thus the drain regions of the NMOS transistors N1 and N2 are electrically connected to the conductive line 230f.

For the NMOS transistor N1, the channel region CH-N1 is formed between the N-type doping regions 360a and 360b and under the gate electrode 220b. For the NMOS transistor N2, the channel region CH-N2 is formed between the N-type doping regions 360b and 360c and under the gate electrode 220c. Furthermore, the dummy gate electrodes 220a and 220d are located upon the edge of the semiconductor fin 210c. For example, the dummy gate electrodes 220a is arranged upon the left edge of the semiconductor fin 210c, and the dummy gate electrodes 220d is arranged upon the right edge of the semiconductor fin 210c.

Figure 4C:
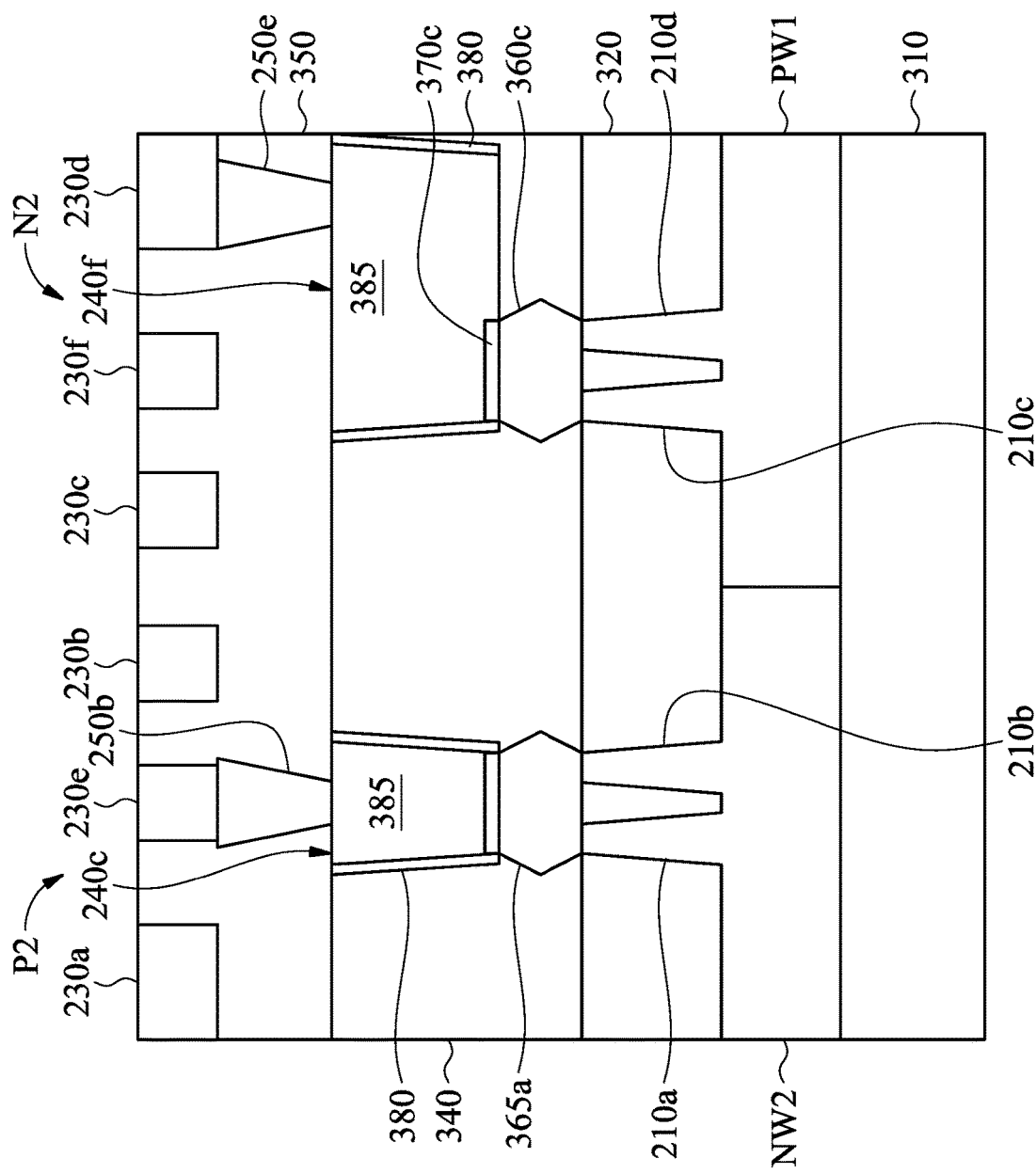
FIG. 4C illustrates a cross-sectional view of the semiconductor structure of the first logic cell along line E-EE in FIG. 3, in accordance with some embodiments of the disclosure.

FIG. 4C illustrates a cross-sectional view of the semiconductor structure of the first logic cell 10A along line E-EE in FIG. 3, in accordance with some embodiments of the disclosure. The P-type well region PW1 and the N-type well region NW1 are formed over the substrate 310. The semiconductor fins 210c and 210d are formed on the P-type well region PW1, and the semiconductor fins 210a and 210b are formed on the N-type well region NW1. The semiconductor fins 210a through 210d are separated from each other by the STI 320.

The ILD 340 is formed over the STI 320 and the semiconductor fins 210a through 210d. The N-type doping region 360c forms the source/drain region of the NMOS transistor N2 on the semiconductor fins 210c and 210d. The source/drain silicide region 370c is formed on the N-type doping region 360c. In some embodiments, the N-type doping region 360c is formed by epitaxy material, and the epitaxy material is selected from a group consisting of SiP content, or SiC content, or SiPC, or Si, or a combination thereof.

The P-type doping region 365a forms the source/drain region of the PMOS transistor P2 on the semiconductor fins 210a and 210b. The source/drain silicide region 370g is formed on the P-type doping region 365a. In some embodiments, the P-type doping region 365a is formed by epitaxy material, and the epitaxy material is selected from a group consisting of SiGe, or SiGeC, or Ge, or Si, or a combination thereof.

The contact 240f is formed on the source/drain silicide regions 370c, and the contact 240c is formed on the source/drain silicide regions 370c. Each of the contacts 240f and 240c includes a metal plug 385 and a high-K dielectric 380 formed on the sidewall of the metal plug 385. In other words, the metal plug 385 is surrounded by the high-K dielectric 380.

In some embodiments, the dielectric constant of the high-K dielectric 380 is greater than 4.9 or 5. In some embodiments, the thickness of the high-K dielectric 380 is within a range of 5 to 50 Å. In some embodiments, the material of the high-K dielectric 380 is selected from a group consisting of a nitride-based dielectric, a metal oxide dielectric, Hf oxide ($HfO_2$), Ta oxide ($Ta_2O_5$), Ti oxide ($TiO_2$), Zr oxide ($ZrO_2$), Al oxide ($Al_2O_3$), Y oxide ($Y_2O_3$), or a combination thereof. In some embodiments, the material of the high-K dielectric 380 is selected from a group consisting of SiON, $Ta_2O_5$, $Al_2O_3$, nitrogen-content oxide layer, nitrided oxide, metal oxide dielectric, Hf-content oxide, Ta-content oxide, Ti-content oxide, Zr-content oxide, Al-content oxide, La-content oxide or a combination thereof.

The vias 250b and 250e and the conductive lines 230a through 230f are formed in the ILD layer 350. The N-type doping region 360c is electrically connected to the conductive line 230d through the via 250e, the contact 240f and the source/drain silicide region 370c, thus the source region of the NMOS transistor N2 is electrically connected to a VSS line through the conductive line 230d. Furthermore, the P-type doping region 365a is electrically connected to the conductive line 230e through the via 250b, the contact 240c and the source/drain silicide region 370g, thus the drain region of the PMOS transistor P2 is electrically connected to the drain regions of the NMOS transistors N1 and N2 through the conductive line 230e and the overlying levels. In other words, the contact 240c corresponding to the drain region of the PMOS transistor P2 is electrically connected to the contact 240e corresponding to the drain regions of the NMOS transistors N1 and N2 through the overlying levels of the conductive lines 230a through 230f.

Figure 5:
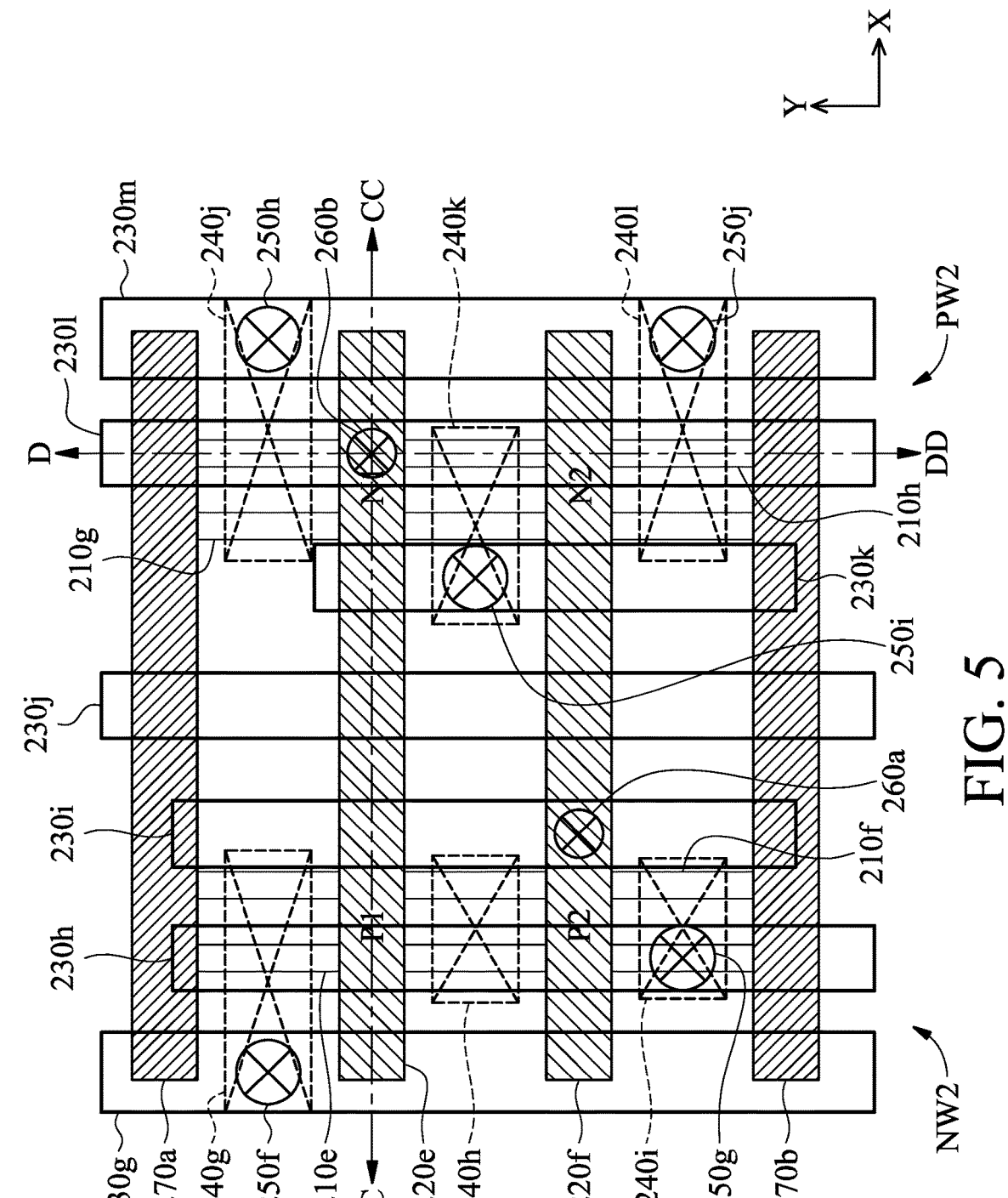
FIG. 5 illustrates the layout of the semiconductor structure of a second logic cell, in accordance with some embodiments of the disclosure.

FIG. 5 illustrates the layout of the semiconductor structure of a second logic cell 20A, in accordance with some embodiments of the disclosure. In FIG. 5, the NOR logic gate of FIGS. 2A and 2B is implemented in the second logic cell 20A, and the PMOS transistors P1 and P2 and the NMOS transistors N1 and N2 are dual-fin FETs. For the NOR logic gate of FIGS. 2A and 2B, the first logic cell 10A in FIG. 3 and the second logic cell 20A in FIG. 5 have the same circuit configuration and different layout configurations.

In FIG. 5, the semiconductor fins 210e and 210f extending in the Y-direction are disposed over an N-type well region NW2, and the semiconductor fins 210g and 210h extending in the Y-direction are disposed over a P-type well region PW2. A gate electrode 220e extending in the X-direction forms the PMOS transistor P1 with an underlying active region formed by the semiconductor fins 210e and 210f over the N-type well region NW2. Furthermore, the gate electrode 220e forms the NMOS transistor N1 with an underlying active region formed by the semiconductor fins 210g and 210h in the P-type well region PW2. In other words, the gate electrode 220e is shared by the NMOS transistor N1 and the PMOS transistor P1. The gate electrode 220e is coupled to a conductive line 230l extending in the Y-direction through a gate contact 260b, and the conductive line 230l is configured to connect the gate electrode 220e to an overlying level for receiving the input signal IN1.

A gate electrode 220f extending in the X-direction forms the PMOS transistor P2 with an underlying active region formed by the semiconductor fins 210e and 210f over the N-type well region NW2. Furthermore, the gate electrode 220f forms the NMOS transistor N2 with an underlying active region formed by the semiconductor fins 210g and 210h in the P-type well region PW2. In other words, the gate electrode 220f is shared by the NMOS transistor N2 and the PMOS transistor P2. The gate electrode 220f is coupled to a conductive line 230i extending in the Y-direction through a gate contact 260a, and the conductive line 230i is configured to connect the gate electrode 220f to an overlying level for receiving the input signal IN2.

In some embodiments, the structure of the gate electrodes 220e and 220f includes multiple material structure selected from a group consisting of poly gate/SiON structure, metals/high-K dielectric structure, Al/refractory metals/high-K dielectric structure, silicide/high-K dielectric structure, or a combination thereof.

The gate dielectrics 270a and 270b extending in the X-direction are dummy gate dielectrics. The gate electrodes 220e and 220f are arranged between the gate dielectrics 270a and 270b, and the NMOS transistors N1 and N2 and the PMOS transistors P1 and P2 are surrounded by the gate dielectrics 270a and 270b.

A conductive line 230g extending in the Y-direction is coupled to the source region of the PMOS transistor P1 through the contact 240g and the via 250f, and the conductive line 230g is configured to connect the source region of the PMOS transistor P1 to an overlying level for coupling the power supply VDD.

A conductive line 230m extending in the Y-direction is coupled to the source region of the NMOS transistor N1 through the contact 240j and the via 250h and to the source region of the NMOS transistor N2 through the contact 240l and the via 250j. The conductive line 230m is configured to connect the source regions of the NMOS transistors N1 and N2 to an overlying level for coupling the ground VSS.

In some embodiments, each of the vias 250f through 250j and the vias 260a and 260b includes a metal plug made of the same material. In some embodiments, the material of the metal plug is purely W (Tungsten) or purely Ru (Ruthenium) without sidewall barrier layer metal. In some embodiments, the material of the metal plug is selected from a group consisting of Ti, TiN, TaN, Co, Ru, Pt, W, Al, Cu, or a combination thereof.

In some embodiments, each of the contacts 240g through 240l includes a metal plug made of the same material. In some embodiments, the material of the metal plug is selected from a group consisting of Ti, TiN, TaN, Co, Ru, Pt, W, Al, Cu, or a combination thereof. In some embodiments, contacts 240g through 240l are slot-shaped.

In some embodiments, the source/drain regions of the PMOS transistor P1 and P2 are formed by the P-type doping region including epitaxy material. The epitaxy material is selected from a group consisting of SiGe, or SiGeC, or Ge, or Si, or a combination thereof.

In some embodiments, the source/drain regions of the NMOS transistor N1 and N2 are formed by the N-type doping region including epitaxy material. The epitaxy material is selected from a group consisting of SiP content, or SiC content, or SiPC, or Si, or a combination thereof.

Figure 6A:
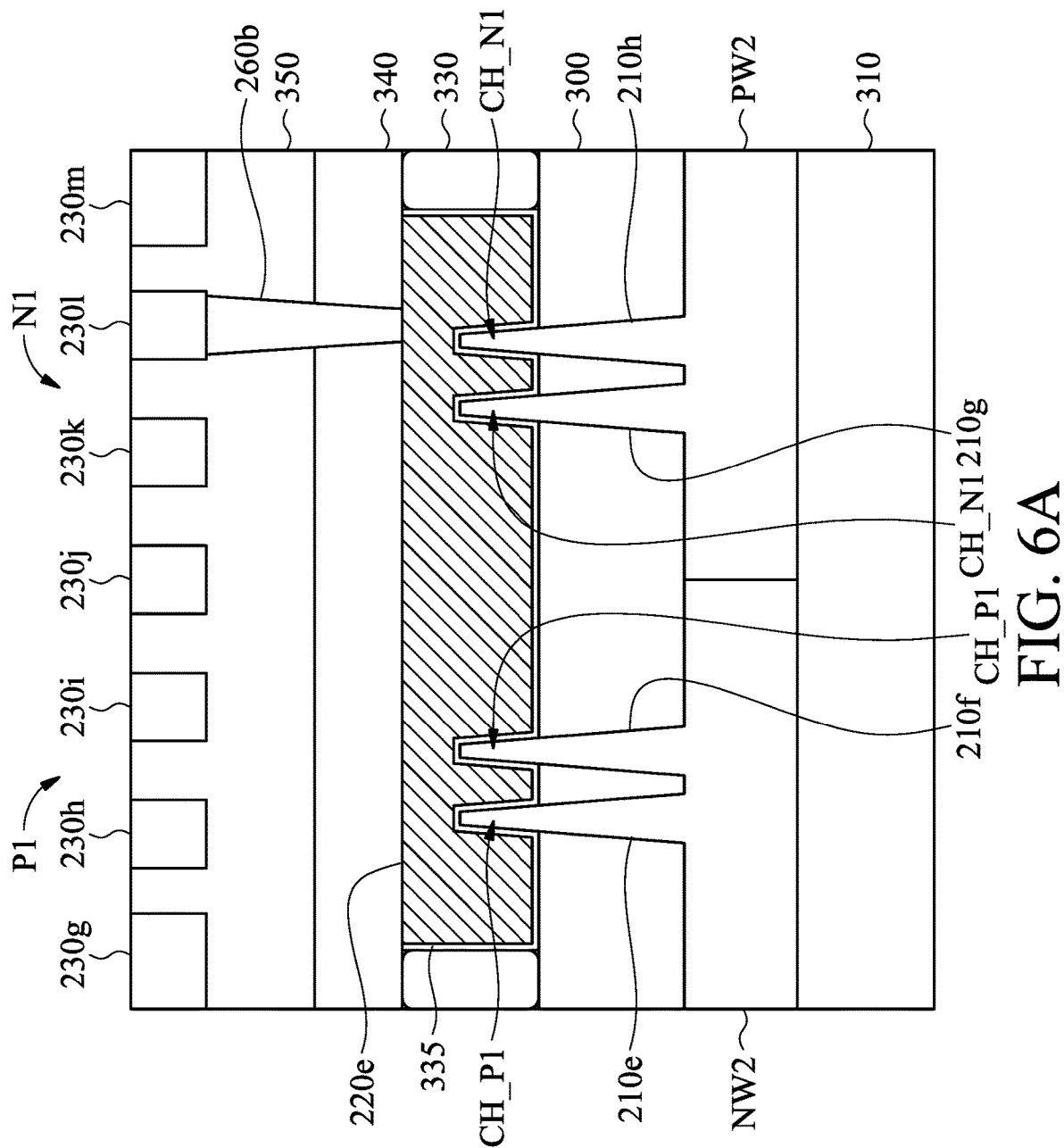
FIG. 6A illustrates a cross-sectional view of the semiconductor structure of the second logic cell along line C-CC in FIG. 5, in accordance with some embodiments of the disclosure.

FIG. 6A illustrates a cross-sectional view of the semiconductor structure of the second logic cell 20A along line C-CC in FIG. 5, in accordance with some embodiments of the disclosure. The P-type well region PW2 and the N-type well region NW2 are formed over a substrate 310. In some embodiments, the substrate 310 is a Si substrate. In some embodiments, the material of the substrate 310 is selected from a group consisting of bulk-Si, SiP, SiGe, SiC, SiPC, Ge, SOI-Si, SOI-SiGe, III-VI material, or a combination thereof.

The semiconductor fins 210e and 210f are formed on the N-type well region NW2. In some embodiments, the semiconductor fins 210e and 210f include an appropriate concentration of n-type dopants (e.g., phosphorous (such as 31P), arsenic, or a combination thereof). The semiconductor fins 210e and 210f are separated from each other by the shallow trench isolation (STI) 320.

The semiconductor fins 210g and 210h are formed on the P-type well region PW2. In some embodiments, the semiconductor fins 210g and 210h include an appropriate concentration of P-type dopants (e.g., boron (such as 11B), boron, boron fluorine (BF$_2$), or a combination thereof). Furthermore, the semiconductor fins 210g and 210h are separated from each other by the STI 320.

The gate electrode 220e is formed over the gate dielectrics 335 and is positioned over a top surface of the semiconductor fins 210e through 210h. Each of the semiconductor fins 210e and 210f overlapping the gate electrode 220e may serve as a channel region CH_P1 of the PMOS transistor P1. Thus, the gate electrode 220e and the gate dielectrics 335 over the semiconductor fins 210e and 210f form a gate structure for the PMOS transistor P1. Furthermore, each of the semiconductor fins 210g and 210h overlapping the gate electrode 220e may serve as a channel region CH_N1 of the NMOS transistor N1. Thus, the gate electrode 220e and the gate dielectrics 335 over the semiconductor fins 210g and 210h form a gate structure for the NMOS transistor N1. In some embodiments, the spacers 330 are formed on opposite sides of the gate electrode 220e.

ILD layer 340 is formed over the gate electrode 220e and the spacer 330. The ILD layer 340 may be formed of an oxide such as Phospho-Silicate Glass (PSG), Boro-Silicate Glass (BSG), Boron-Doped Phospho-Silicate Glass (BPSG), Tetra Ethyl Ortho Silicate (TEOS) oxide, or the like.

IMD layer 350 is formed over the ILD layer 340. The conductive lines 230g through 230m are formed in the IMD layer 350. In some embodiments, the conductive lines 230g through 230m are metal lines formed in the same metal layer. The gate electrode 220e is electrically connected to the conductive line 230l through the via 260b, thus the gate regions of the PMOS transistor P1 and the NMOS transistor N1 are electrically connected to the conductive line 230l.

The via 260b is directly (physically) connected to the gate electrode 220e without through one contact. Unlike via 255b in FIG. 4A formed in the IMD layer 350, via 260b in FIG. 6A is formed through the IMD layer 350 and the ILD layer 340. In some embodiments, dimensions of via 260b in FIGS. 5 and 6A are smaller than those of via 255b in FIGS. 3 and 4A in layout. For example, via 260b in FIG. 5 and via 255b in FIG. 3 are round, and the radius of via 260b in FIG. 5 is at least 20% smaller than the radius of via 255b in FIG. 3.

In FIG. 5, the layout and dimensions of vias 260a and 260b, which are directly connected to the gate electrodes 220e and 220f, are smaller than those of vias 250f through 250j, which are connected to the contacts 240g through 240l. For example, the vias 260a and 260b and vias 250f through 250j are round, and the radius of vias 260a and 260b is smaller than the radius of vias 250f through 250j. In some embodiments, the radius of vias 260a and 260b is at least 20% smaller than the radius of vias 250f through 250j.

The via 260b is disposed over the gate electrode 220e and overlaps the semiconductor fin 210h. In other words, a projection of the via 260b overlaps the projection of the semiconductor fin 210h on the substrate 310. In some embodiments, the via 260b is disposed over the gate electrode 220e and overlaps the semiconductor fin 210g, therefore the projection of the via 260b overlaps the projection of the semiconductor fin 210g on the substrate 310.

By using the gate electrode pickup layout that the via 260b is directly connecting the gate electrode 220e, routing efficiency and logic circuit density improvement are increased for the standard cells.

Figure 6B:
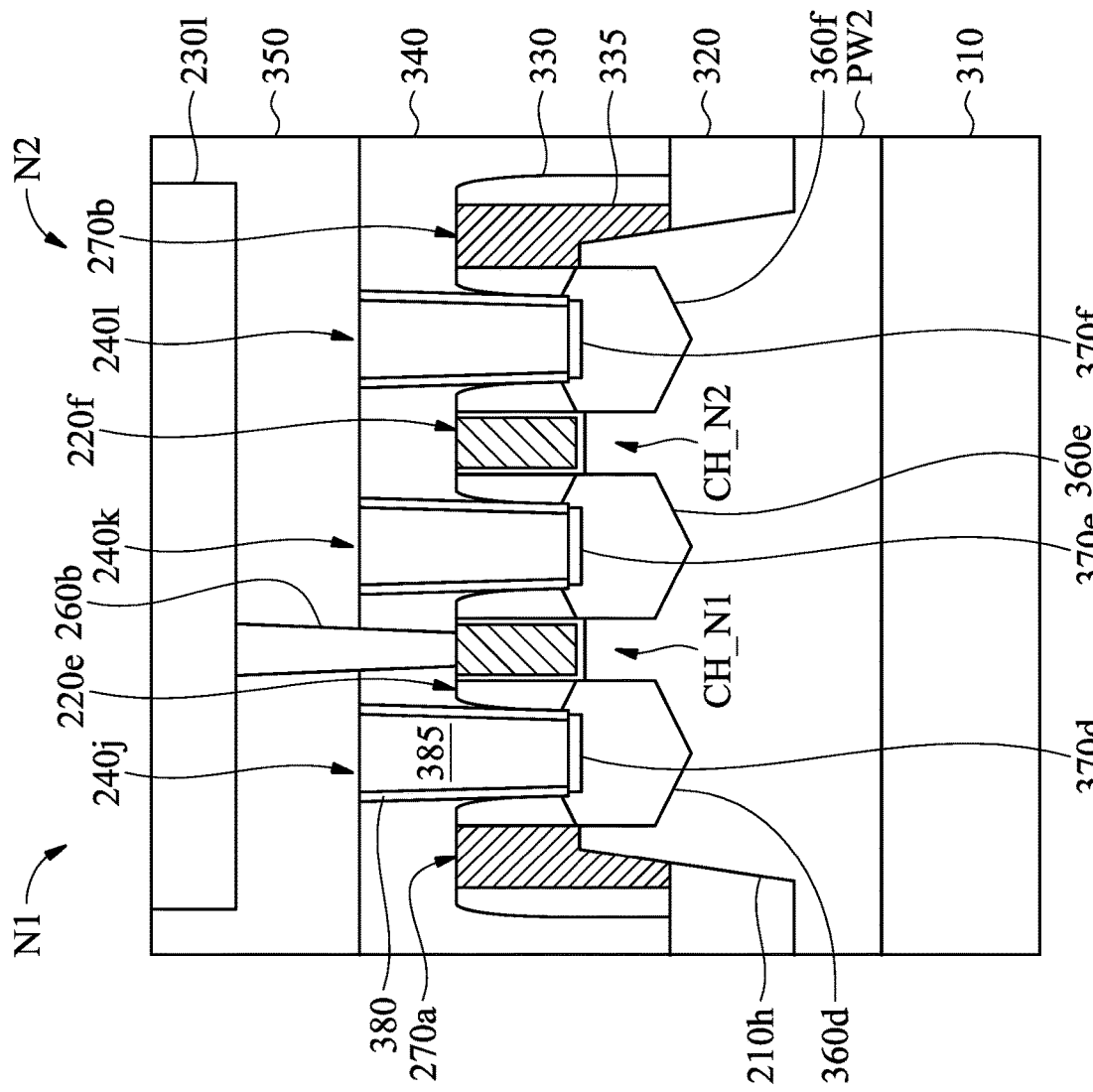
FIG. 6B illustrates a cross-sectional view of the semiconductor structure of the second logic cell along line D-DD in FIG. 5, in accordance with some embodiments of the disclosure.

FIG. 6B illustrates a cross-sectional view of the semiconductor structure of the second logic cell 20A along line D-DD in FIG. 5, in accordance with some embodiments of the disclosure. The P-type well region PW2 is formed over the substrate 310. The semiconductor fin 210h is formed on the P-type well region PW2, and is surrounded by the STI 320.

The ILD 340 is formed over the STI 320. The N-type doping regions 360d through 360f form the source/drain regions on the semiconductor fin 210h. The source/drain silicide regions 370d through 370f are formed on the N-type doping regions 360d through 360f, respectively. The contacts 240j through 240l are formed on the source/drain silicide regions 370d through 370f, respectively. Each of the contacts 240j through 240l includes a metal plug 385 and a high-K dielectric 380 formed on the sidewall of the metal plug 385. In other words, the metal plug 385 is surrounded by the high-K dielectric 380.

In some embodiments, the dielectric constant of the high-K dielectric 380 is greater than 4.9 or 5. In some embodiments, the thickness of the high-K dielectric 380 is within a range of 5 to 50 Å. In some embodiments, the material of the high-K dielectric 380 is selected from a group consisting of a nitride-based dielectric, a metal oxide dielectric, Hf oxide ($HfO_2$), Ta oxide ($Ta_2O_5$), Ti oxide ($TiO_2$), Zr oxide ($ZrO_2$), Al oxide ($Al_2O_3$), Y oxide ($Y_2O_3$), or a combination thereof. In some embodiments, the material of the high-K dielectric 380 is selected from a group consisting of SiON, $Ta_2O_5$, $Al_2O_3$, nitrogen-content oxide layer, nitrided oxide, metal oxide dielectric, Hf-content oxide, Ta-content oxide, Ti-content oxide, Zr-content oxide, Al-content oxide, La-content oxide or a combination thereof.

The conductive line 230l is formed in the ILD layer 350. The gate electrode 220e is electrically connected to the conductive line 230l through the via 260b without any contact, thus the gate region of the NMOS transistor N1 is electrically connected to the conductive line 230l.

For the NMOS transistor N1, the channel region CH-N1 is formed between the N-type doping regions 360d and 360e and under the gate electrode 220e. For the NMOS transistor N2, the channel region CH-N2 is formed between the N-type doping regions 360e and 360f and under the gate electrode 220f. Furthermore, the dummy gate dielectrics 270a and 270b are located upon the edge of the semiconductor fin 210h. For example, the dummy gate dielectric 270a is arranged upon the left edge of the semiconductor fin 210h, and the dummy gate dielectric 270b is arranged upon the right edge of the semiconductor fin 210h.

Figure 7A:
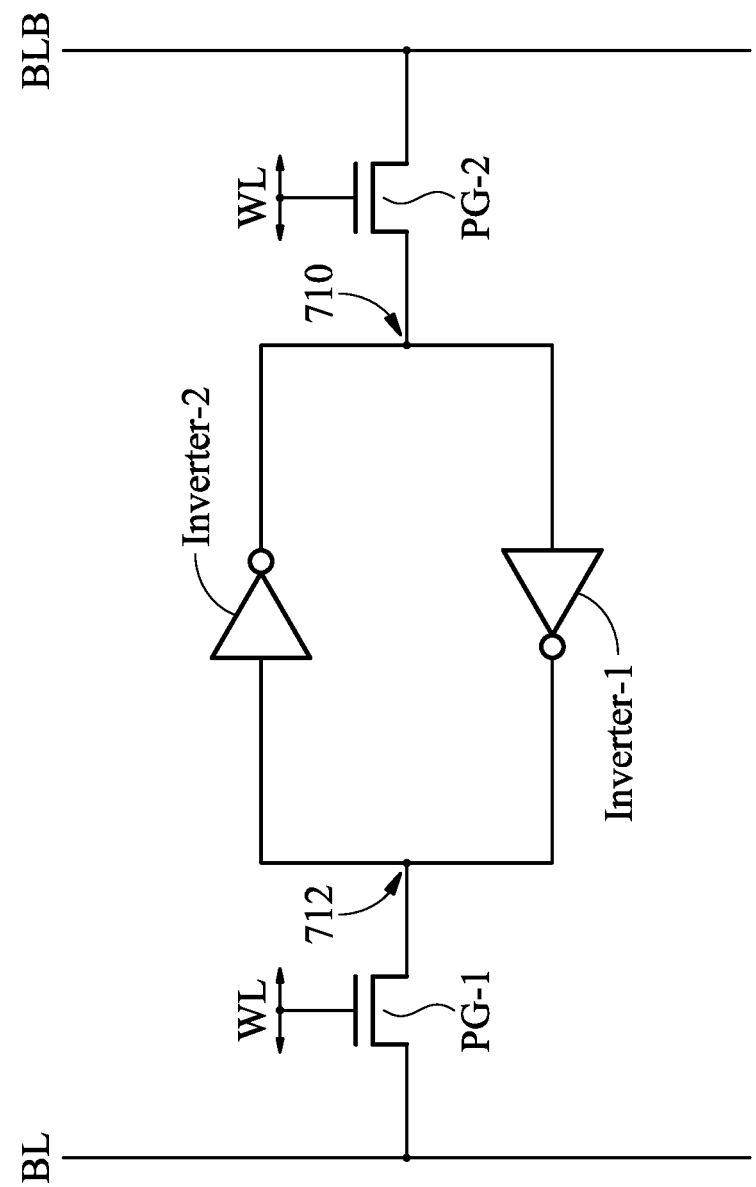
FIG. 7A illustrates a memory cell, in accordance with some embodiments of the disclosure.

FIG. 7A illustrates a memory cell 30A, in accordance with some embodiments of the disclosure. In this embodiment, the memory cell 30A is a single-port SRAM bit cell. The memory cell 30A includes a pair of cross-coupled inverters Inverter-1 and Inverter-2, and two pass-gate transistors PG-1 and PG-2. The inverters Inverter-1 and Inverter-2 are cross-coupled between the nodes 712 and 710, and form a latch circuit. The pass-gate transistor PG-1 is coupled between a bit line BL and the node 712, and the pass-gate transistor PG-2 is coupled between a complementary bit line BLB and the node 710, wherein the complementary bit line BLB is complementary to the bit line BL. The gates of the pass-gate transistors PG-1 and PG-2 are coupled to the same word-line WL. Furthermore, the pass-gate transistors PG-1 and PG-2 are NMOS transistors.

Figure 7B:
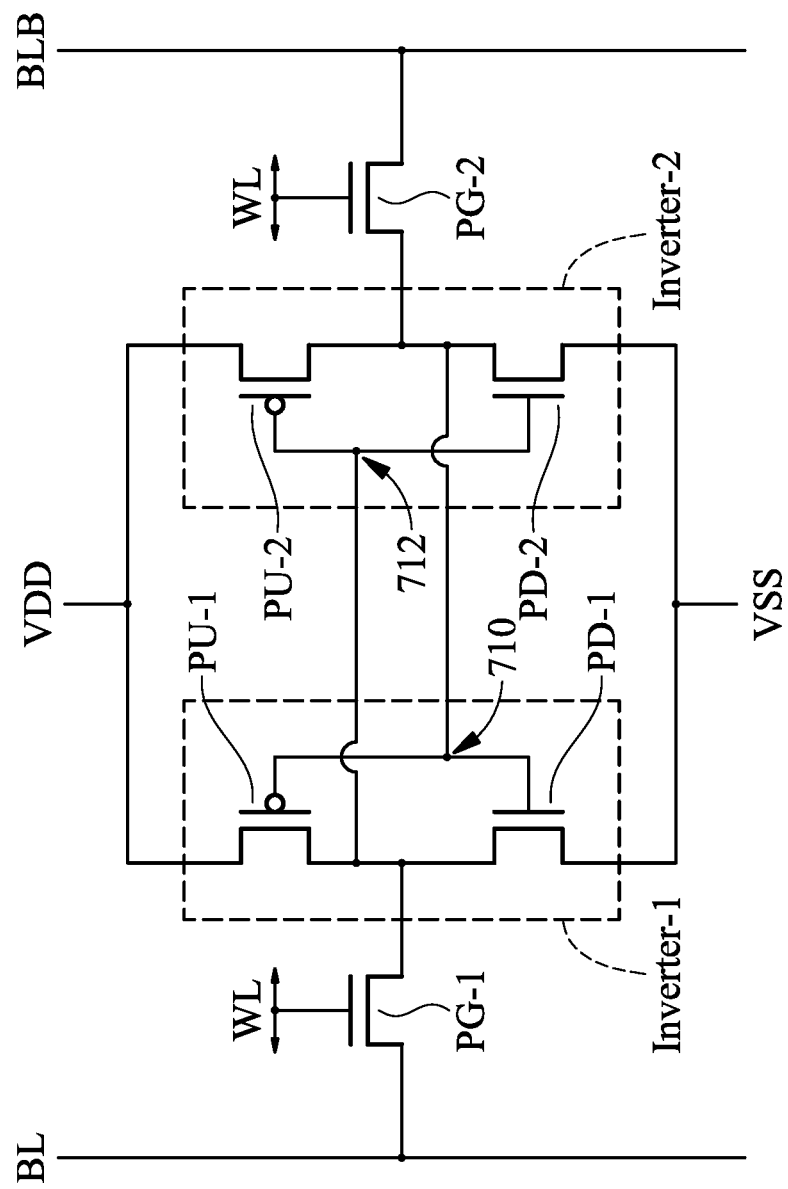
FIG. 7B is a simplified diagram of the memory cell in FIG. 7A, in accordance with some embodiments of the disclosure.

FIG. 7B is a simplified diagram of the memory cell 30A in FIG. 7A, in accordance with some embodiments of the disclosure. The inverter Inverter-1 includes a pull-up transistor PU-1 and a pull-down transistor PD-1. The pull-up transistor PU-1 is a PMOS transistor, and the pull-down transistor PD-1 is an NMOS transistor. The drain of the pull-up transistor PU-1 and the drain of the pull-down transistor PD-1 are coupled to the node 712 connecting the pass-gate transistor PG-1. The gates of the pull-up transistor PU-1 and the pull-down transistor PD-1 are coupled to the node 710 connecting the pass-gate transistor PG-2. Furthermore, the source of the pull-up transistor PU-1 is coupled to the power supply VDD, and the source of the pull-down transistor PD-1 is coupled to a ground VSS.

Similarly, the inverter Inverter-2 includes a pull-up transistor PU-2 and a pull-down transistor PD-2. The pull-up transistor PU-2 is a PMOS transistor, and the pull-down transistor PD-2 is an NMOS transistor. The drains of the pull-up transistor PU-2 and the pull-down transistor PD-2 are coupled to the node 710 connecting the pass-gate transistor PG-2. The gates of the pull-up transistor PU-2 and the pull-down transistor PD-2 are coupled to the node 712 connecting the pass gate transistor PG-1. Furthermore, the source of the pull-up transistor PU-2 is coupled to the power supply VDD, and the source of the pull-down transistor PD-2 is coupled to the ground VSS.

In some embodiments, the pass-gate transistors PG-1 and PG-2, the pull-up transistors PU-1 and PU-2, and the pull-down transistors PD-1 and PD-2 of the SRAM cell 10 are fin field effect transistors (FinFETs).

In some embodiments, the pass-gate transistors PG-1 and PG-2, the pull-up transistors PU-1 and PU-2, and the pull-down transistors PD-1 and PD-2 of the SRAM cell 10 are planar MOS devices.

Figure 8:
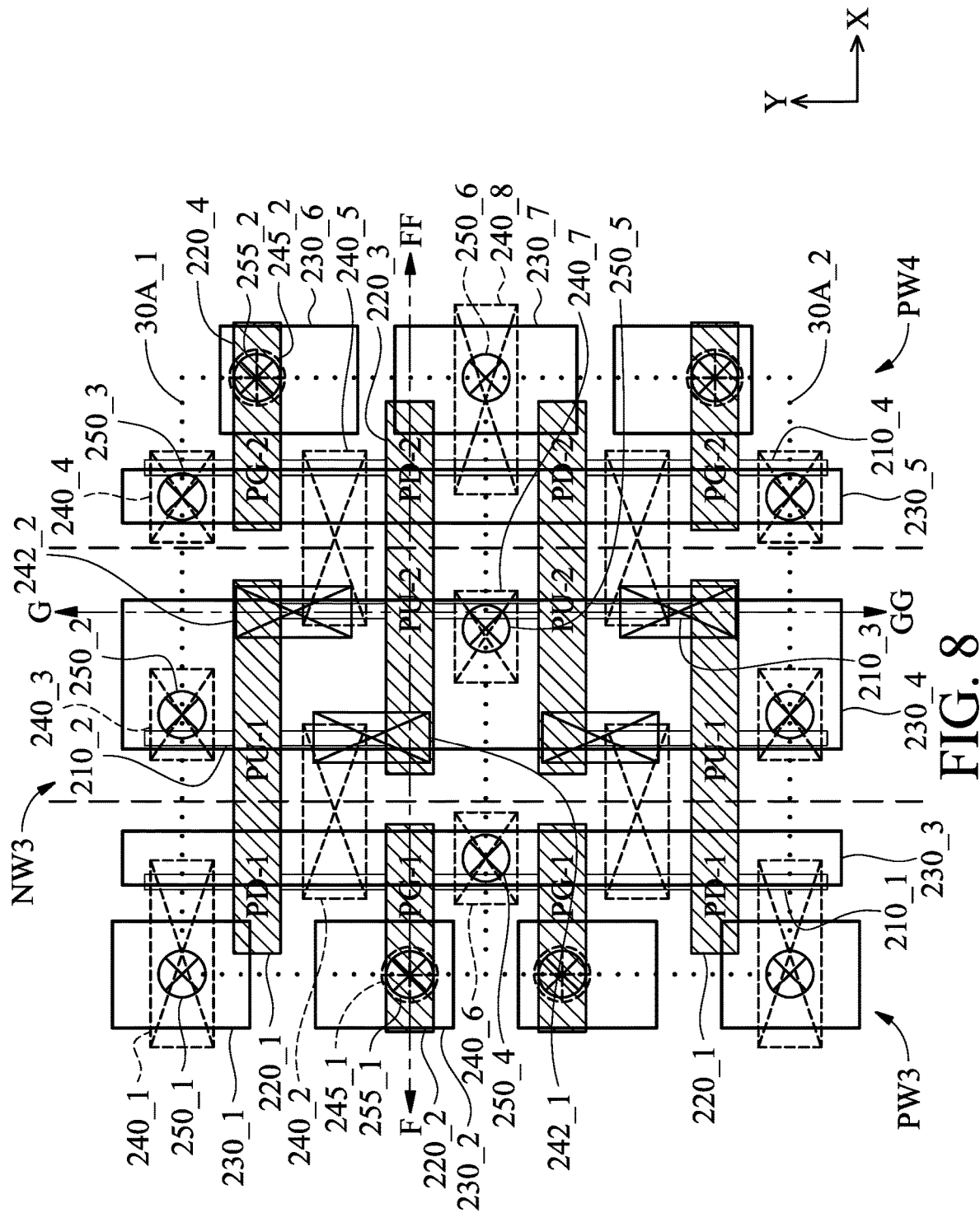
FIG. 8 illustrates the layout of the semiconductor structure of two memory cells, in accordance with some embodiments of the disclosure.

FIG. 8 illustrates the layout of the semiconductor structure of two memory cells 30A_1 and 30A_2, in accordance with some embodiments of the disclosure. In this embodiment, the memory cells 30A_1 and 30A_2 are single-port SRAM bit cells of FIGS. 7A and 7B. In this embodiment, the two adjacent memory cells 30A_1 and 30A_2 are arranged in mirror symmetry along the X-direction. In some embodiments, the two adjacent memory cells 30A_1 and 30A_2 are arranged in mirror symmetry along the Y-direction.

An N-type well region NW3 is at the middle of memory cells 30A_1 and 30A_2, and two P-type well regions PW3 and PW4 are on opposite sides of N-type well region NW3. A gate electrode 220_1 forms the pull-up transistor PU-1 with an underlying semiconductor fin 220_2 over the N-type well region NW3. The gate electrode 220_1 may be disposed over and extend along the sidewalls of the semiconductor fin 220_2. The gate electrode 220_1 further forms the pull-down transistor PD-1 with the underlying semiconductor fin 210_1 in P-type well region PW3 (e.g., on the left side of N-type well region NW3). In other words, the gate electrode 220_1 is shared by the pull-up transistor PU-1 and the pull-down transistor PD-1. The gate electrode 220_1 may be disposed over and extend along the sidewalls of the semiconductor fin 210_1.

The gate electrode 220_2 forms the pass-gate transistor PG-1 with the semiconductor fin 210_1. In other words, the semiconductor fin 210_1 is shared by the pass-gate transistor PG-1 and the pull-down transistor PD-1. In some embodiments, the gate electrode 220_2 is disposed over and extends along the sidewalls of the semiconductor fin 210_1.

The gate electrode 220_3 forms the pull-up transistor PU-2 with an underlying semiconductor fin 210_3 over the N-type well region NW3. The gate electrode 220_3 further forms the pull-down transistor PD-2 with an underlying semiconductor fin 210_4 in the P-type well region PW4 (e.g., on the right side of the N-type well region NW3). In other words, the gate electrode 220_3 is shared by the pull-up transistor PU-2 and the pull-down transistor PD-2. The gate electrode 220_3 may be disposed over and extend along the sidewalls of the semiconductor fin 210_4.

Gate electrode 220_4 forms the pass-gate transistor PG-2 with the underlying semiconductor fin 210_4. In other words, the semiconductor fin 210_4 is shared by the pass-gate transistor PG-2 and the pull-down transistor PD-2. In some embodiments, the gate electrode 220_4 is disposed over and extends along the sidewalls of the semiconductor fin 210_4.

As described above, the pass-gate transistors PG-1 and PG-2, the pull-up transistors PU-1 and PU-2, and the pull-down transistors PD-1 and PD-2 are FinFETs, and the semiconductor fins 210_1 through 210_4 include one or more fin structures. In some embodiments, one or more of the pass-gate transistors PG-1 and PG-2, the pull-up transistors PU-1 and PU-2, and the pull-down transistors PD-1 and PD-2 are planar MOS devices having semiconductor fins doped in an upper surface of a semiconductor substrate. The semiconductor fins 210_1 through 210_4 provide source/drains of various transistors on opposing sides of a respective gate electrode.

FIG. 8 illustrates a single fin for each of the semiconductor fins 210_1 through 210_4. In some embodiments, there may be a single fin, two fins, three fins, or more for the semiconductor fins 210_1 through 210_4, and the number of fins in the semiconductor fins 210_1 through 210_4 may be the same or different as other semiconductor fins in the memory cells 30A_1 and 30A_2.

In FIG. 8, the contact 240_5 is a longer contact, and is elongated and has a longitudinal direction in the X direction, which is parallel to the extending directions of the gate electrodes 220_1 and 220_3. The contact 242_2 is a butt contact, and includes a portion over, and electrically connected to, the gate electrode 220_1. In some embodiments, the contact 242_2 has a longitudinal direction in the Y direction, which is perpendicular to the X direction. In the manufacturing of the memory cell 30A_1 on the semiconductor wafers, the contact 240_5 and the contact 242_2 may be formed as a single continuous butt contact.

The contact 240_2 is a longer contact, and is elongated and has a longitudinal direction in the X direction. The contact 242_1 is a butt contact, and includes a portion over, and electrically connected to, the gate electrode 220_3. In such embodiments, the details of the contact 242_1 and the contact 240_2 may be similar to the contact 242_2 and the contact 240_5, respectively, and are not repeated herein for simplicity.

The gate contacts 245_1 and 245_2 are connected to the gate electrodes 220_2 and 220_4, respectively. The gate contacts 245_1 and 245_2 may be used to electrically couple the gate electrodes 220_2 and 220_4 to one or more word-line WL as described in greater detail below.

The contacts 240_1 and 240_8 are used to connect to the source regions of the pull-down transistors PD-1 and PD-2 to the VSS lines (e.g., the electrical ground lines). The contacts 240_1 and 240_8 have lengthwise directions parallel to the X direction, and may be formed to overlap the corners of the memory cells 30A_1 and 30A_2. Furthermore, the contacts 240_1 and 240_8 may further extend into neighboring memory cells 30A in a different column adjacent the memory cell 30A. The contacts 240_1 and 240_8 may further be shared between two neighboring memory cells 30A in the adjacent rows.

The contacts 240_3 and 240_7 are used to connect to the source regions of pull-up transistors PU-1 and PU-2 to the VDD lines (e.g., supply voltage lines). The contacts 240_3 and 240_7 may further be shared between two neighboring memory cells 30A in the adjacent rows. For example, the contact 240_7 is shared between two neighboring memory cells 30A_1 and 30A_2 in the adjacent rows for the pull-up transistors PU-2.

Additionally, the contact 240_6 is used to connect to the source/drain region of pass-gate transistor PG-1 to a bit line BL through a via 250_4. The contact 240_4 is used to connect to the source/drain region of pass-gate transistor PG-2 to a complementary bit line BLB through a via 250_3.

The vias 255_1 and 255_2 are connected to the gate contacts 245_1 and 245_2 (e.g., the gate contacts for pass-gate transistors PG-1 of PG-2). The vias 255_1 and 255_2 are further connected to the conductive lines 230_2 and 230_6, which may be used to electrically couple gate electrodes of the pass gate transistors PG-1 and PG2 to one or more word lines WL. The vias 255_1 and 255_2 and the conductive lines 230_2 and 230_6 may further extend into and shared with neighboring memory cells 30A in the adjacent columns.

Furthermore, the vias 250_1 and 250_6 are connected to the source/drain contacts 240_1 and 240_8 (e.g., the source contacts of the pull-down transistors PD-1 and PD-2), respectively. The vias 250_1 and 250_6 are further connected to the conductive lines 230_1 and 230_7, respectively, and the vias 250_1 and 250_6 may be used to electrically couple sources of the pull-down transistors PD-1 and PD2 to the VSS lines. Furthermore, the vias 250_1 and 250_6 and the conductive lines 230_1 and 230_7 may further extend into neighboring memory cells 30A in the adjacent columns. The vias 250_1 and 250_6 and the conductive lines 230_1 and 230_7 may be shared between two neighboring memory cells 30A in different rows.

In some embodiments, each of the vias 250_1 through 250_6 and the vias 255_1 and 255_2 includes a metal plug made of the same material. In some embodiments, the material of the metal plug is purely W (Tungsten) or purely Ru (Ruthenium) without sidewall barrier layer metal. In some embodiments, the material of the metal plug is selected from a group consisting of Ti, TiN, TaN, Co, Ru, Pt, W, Al, Cu, or a combination thereof.

In some embodiments, each of the contacts 250_1 through 250_6 and the vias 255_1 and 255_2 includes a metal plug made of the same material. In some embodiments, the material of the metal plug is selected from a group consisting of Ti, TiN, TaN, Co, Ru, Pt, W, Al, Cu, or a combination thereof. In some embodiments, the contacts 240g through 240l are slot-shaped.

Figure 9A:
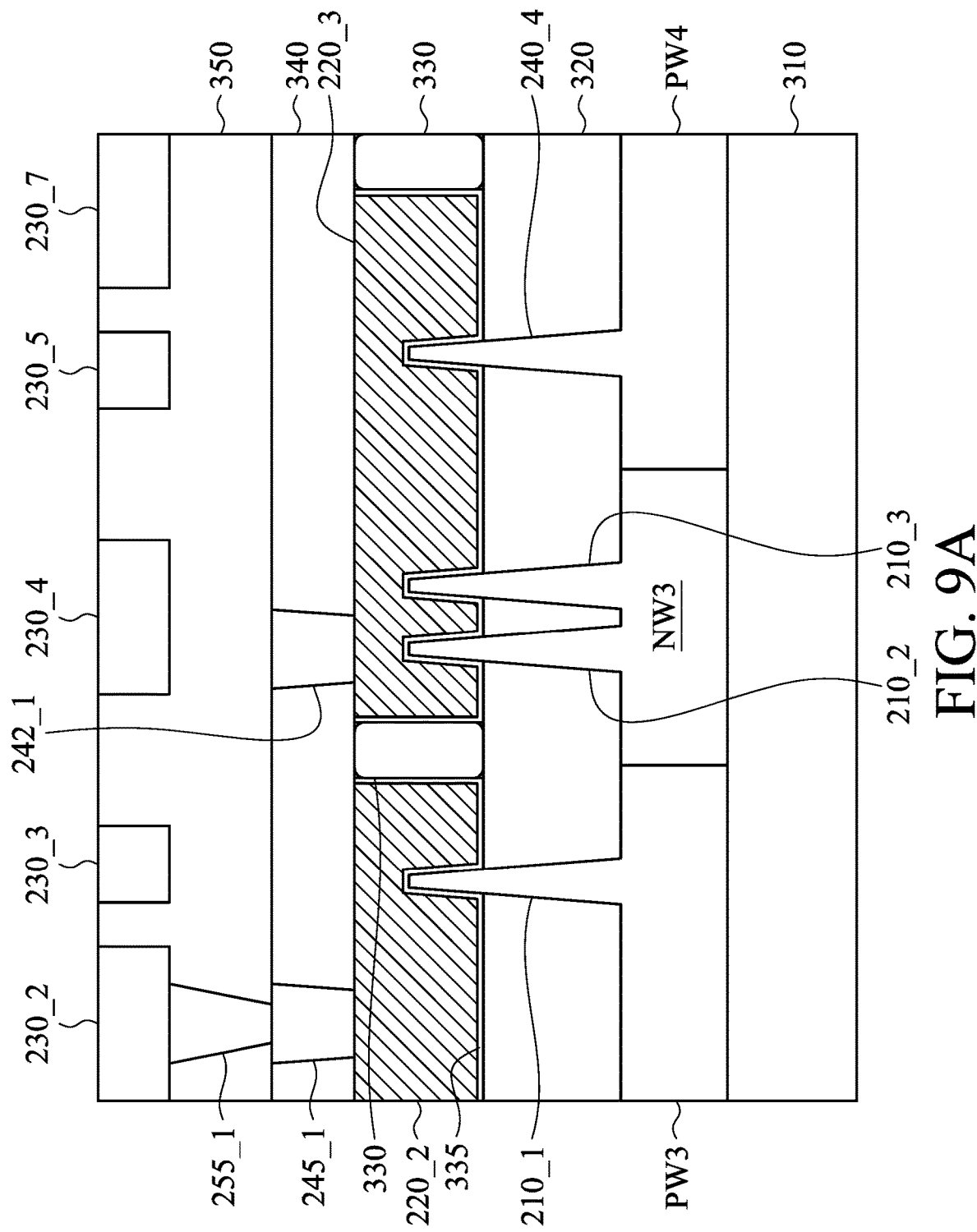
FIG. 9A illustrates a cross-sectional view of the semiconductor structure of the memory cell along line F-FF in FIG. 8, in accordance with some embodiments of the disclosure.

FIG. 9A illustrates a cross-sectional view of the semiconductor structure of the memory cell 30A_1 along line F-FF in FIG. 8, in accordance with some embodiments of the disclosure. The P-type well regions PW3 and PW4 and the N-type well region NW3 are formed over a substrate 310. In some embodiments, the substrate 310 is a Si substrate. In some embodiments, the material of the substrate 310 is selected from a group consisting of bulk-Si, SiP, SiGe, SiC, SiPC, Ge, SOI-Si, SOI-SiGe, III-VI material, or a combination thereof.

The semiconductor fins 210_2 and 210_3 are formed on the N-type well region NW3. In some embodiments, the semiconductor fins 210_2 and 210_3 include an appropriate concentration of n-type dopants (e.g., phosphorous (such as 31P), arsenic, or a combination thereof). The semiconductor fins 210_2 and 210_3 are separated from each other by the shallow trench isolation (STI) 320.

The semiconductor fins 210_1 and 210_4 are formed on the P-type well regions PW3 and PW4, respectively. In some embodiments, the semiconductor fins 210_1 and 210_4 include an appropriate concentration of P-type dopants (e.g., boron (such as 11B), boron, boron fluorine (BF2), or a combination thereof). Furthermore, the semiconductor fins 210_1 and 210_4 are separated from each other by the STI 320.

The gate electrode 220_2 is formed over the gate dielectrics 335 and is positioned over a top surface of the semiconductor fin 210_1. The semiconductor fin 210_1 overlapping the gate electrode 220_2 may serve as a channel region of the pass-gate transistor PG-1. Thus, the gate electrode 220_2 and the gate dielectrics 335 over the semiconductor fin 210_1 form a gate structure for the pass-gate transistor PG-1. The semiconductor fin 210_3 overlapping the gate electrode 220_3 may serve as a channel region of the pull-up transistor PU-2. Thus, the gate electrode 220_3 and the gate dielectrics 335 over the semiconductor fin 210_3 form a gate structure for the pull-up transistor PU-2. The semiconductor fin 210_4 overlapping the gate electrode 220_3 may serve as a channel region of the pull-down transistor PD-2. Thus, the gate electrode 220_3 and the gate dielectrics 335 over the semiconductor fin 210_4 form a gate structure for the pull-down transistor PD-2. In some embodiments, the spacers 330 are formed on opposite sides of the gate electrode 220_3. Furthermore, the gate electrode 220_2 and 220_3 are separated by the spacer 330.

ILD layer 340 is formed over the gate electrodes 220_2 and 220_3 and the spacer 330. The ILD layer 340 may be formed of an oxide such as Phospho-Silicate Glass (PSG), Boro-Silicate Glass (BSG), Boron-Doped Phospho-Silicate Glass (BPSG), Tetra Ethyl Ortho Silicate (TEOS) oxide, or the like.

The contacts 245_1 and 242_1 are formed in the ILD layer 340. Furthermore, the contact 245_1 is disposed over the gate electrode 220_2 and does not overlap the semiconductor fin 210_1. In other words, projection of the contact 245_1 does not overlap the projections of the semiconductor fin 210_1 on the substrate 310, i.e. the projections of the contact 245_1 and the semiconductor fin 210_1 are separated on the substrate 310. Moreover, the contact 242_1 is disposed over the gate electrode 220_3 and does not overlap the semiconductor fins 210_3 and 210_4. In other words, projection of the contact 242_1 does not overlap the projections of the semiconductor fins 210_3 and 210_4 on the substrate 310, i.e. the projections of the contact 242_1 and the semiconductor fins 210_3 and 210_4 are separated on the substrate 310.

IMD layer 350 is formed over the ILD layer 340. The via 255_1 and the conductive lines 230_2 through 230_5 and 230_7 are formed in the IMD layer 350. In some embodiments, the conductive lines 230_2 through 230_5 and 230_7 are metal lines formed in the same metal layer. The gate electrode 220_2 is electrically connected to the conductive line 230_2 through the contact 245_1 and the via 255_1, thus the gate region of the pass-gate transistor PG-1 is electrically connected to the conductive line 230_2.

In some embodiments, the via 255_1 includes a metal plug made of the same material. In some embodiments, the material of the metal plug is purely W (Tungsten) or purely Ru (Ruthenium) without sidewall barrier layer metal. In some embodiments, the material of the metal plug is selected from a group consisting of Ti, TiN, TaN, Co, Ru, Pt, W, Al, Cu, or a combination thereof.

In some embodiments, the contacts 245_1 and 242_1 include a metal plug made of the same material. In some embodiments, the material of the metal plug is selected from a group consisting of Ti, TiN, TaN, Co, Ru, Pt, W, Al, Cu, or a combination thereof.

Figure 9B:
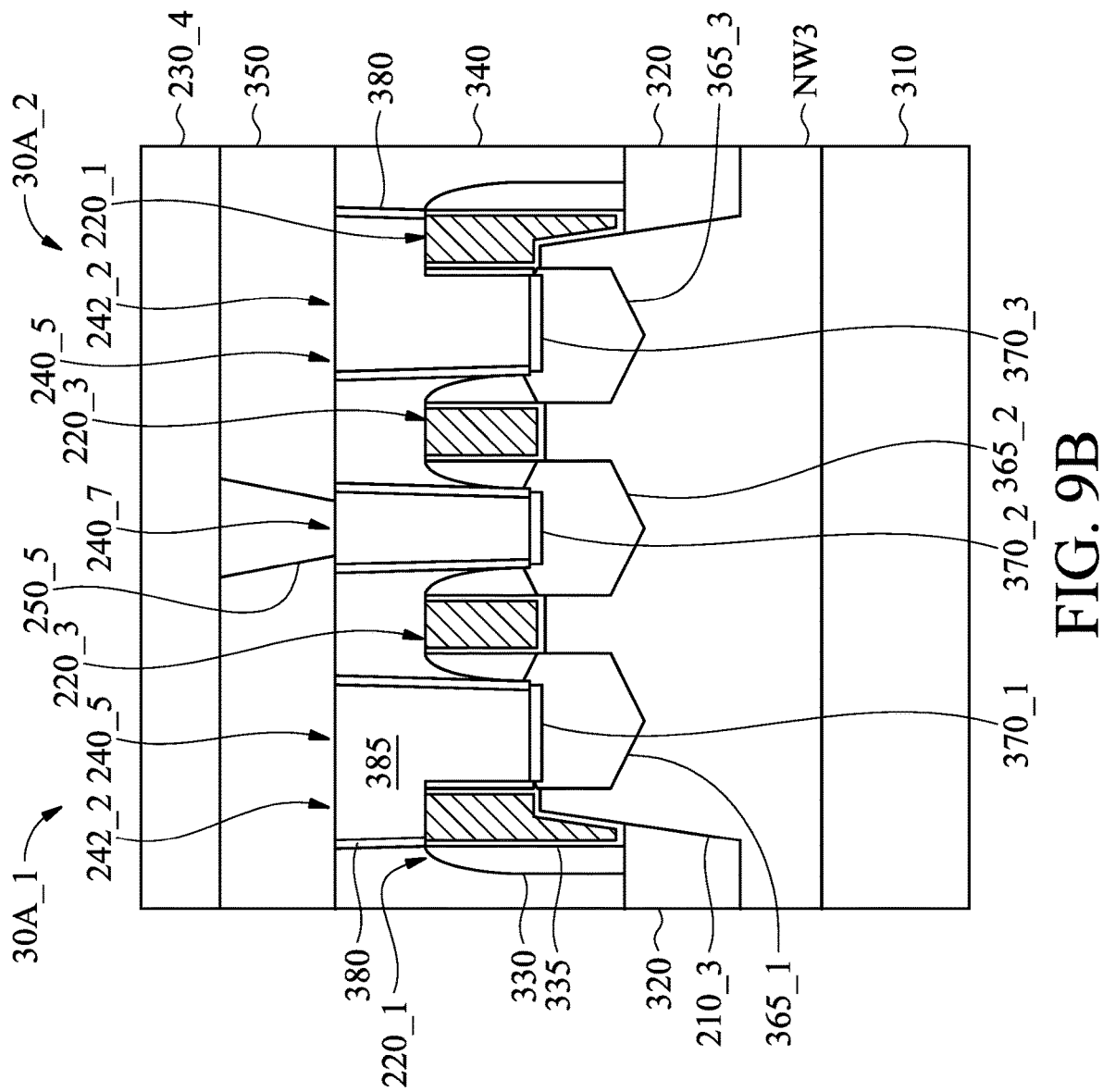
FIG. 9B illustrates a cross-sectional view of the semiconductor structure of the memory cells along line G-GG in FIG. 8, in accordance with some embodiments of the disclosure.

FIG. 9B illustrates a cross-sectional view of the semiconductor structure of the memory cells 30A_1 and 30A_2 along line G-GG in FIG. 8, in accordance with some embodiments of the disclosure. The N-type well region NW3 is formed over the substrate 310. The semiconductor fin 210_3 is formed on the N-type well region NW3, and is surrounded by the STI 320.

The ILD 340 is formed over the STI 320. The P-type doping regions 365_1 through 365_3 form the source/drain regions on the semiconductor fin 210_3. The source/drain silicide regions 370_1 through 370_3 are formed on the P-type doping regions 365_1 through 365_3, respectively. The contacts 240_5 and 240_7 of the memory cells 30A_1 and 30A_2 are formed on the source/drain silicide regions 370_1 through 370_3, respectively. Each of the contacts 240_5 and 240_7 includes a metal plug 385 and a high-K dielectric 380 formed on the sidewall of the metal plug 385. In other words, the metal plug 385 is surrounded by the high-K dielectric 380. Furthermore, the contacts 240_5 and the contact 242_2 may be formed as a single continuous butt contact.

In some embodiments, the dielectric constant of the high-K dielectric 380 is greater than 4.9 or 5. In some embodiments, the thickness of the high-K dielectric 380 is within a range of 5 to 50 Å, where Å=$10^{-10}$ m. In some embodiments, the material of the high-K dielectric 380 is selected from a group consisting of a nitride-based dielectric, a metal oxide dielectric, Hf oxide ($HfO_2$), Ta oxide ($Ta_2O_5$), Ti oxide ($TiO_2$), Zr oxide ($ZrO_2$), Al oxide ($Al_2O_3$), Y oxide ($Y_2O_3$), or a combination thereof. In some embodiments, the material of the high-K dielectric 380 is selected from a group consisting of SiON, $Ta_2O_5$, $Al_2O_3$, nitrogen-content oxide layer, nitrided oxide, metal oxide dielectric, Hf-content oxide, Ta-content oxide, Ti-content oxide, Zr-content oxide, Al-content oxide, La-content oxide or a combination thereof.

The via 250_5 and the conductive line 230_4 are formed in the ILD layer 350. The P-type doping region 365_2 is electrically connected to the conductive line 230_4 through the via 250_5, the contact 240_7 and the source/drain silicide region 370_2, thus the source regions of the pull-up transistors PU-2 of the memory cells 30A_1 and 30A_2 are electrically connected to the conductive line 230_4.

Figure 9C:
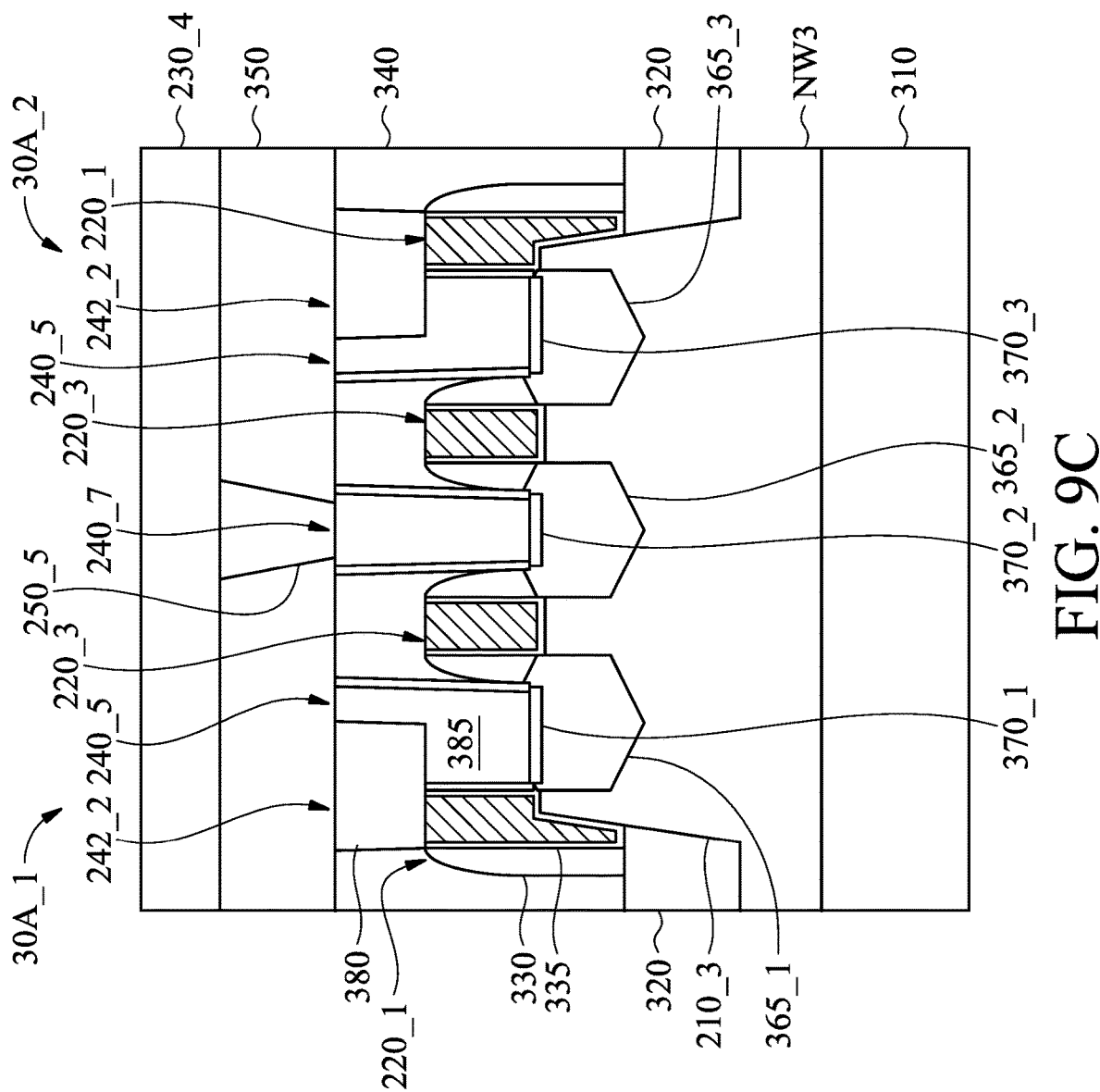
FIG. 9C illustrates a cross-sectional view of the semiconductor structure of the memory cells along line G-GG in FIG. 8, in accordance with some embodiments of the disclosure.

FIG. 9C illustrates another cross-sectional view of the semiconductor structure of the memory cells 30A_1 and 30A_2 along line G-GG in FIG. 8, in accordance with some embodiments of the disclosure. Compared with contact 240_5 and contact 242_2 in FIG. 9B that are formed as a single continuous butt contact, contact 240_5 and contact 242_2 in FIG. 9C are formed in sequence.

Embodiments for semiconductor structures are provided. In an IC, various connection structures are used to connect the source and drain regions and the gate electrodes of the transistors to the conductive line (e.g., the first level metallization layer). By using the via to directly connect the gate electrode without the contact, routing efficiency and logic circuit density improvement are increased for the standard cells in the IC.

In some embodiments, a semiconductor structure is provided. The semiconductor structure includes a first logic cell and a second logic cell. The first logic cell includes a plurality of first transistors over a substrate. Each of the first transistors includes first source and drain regions extending from a first channel region, and a first gate electrode across the first channel region. Each of the first source and drain regions is electrically connected to a first conductive line of a metal layer through a first contact and a first via over the first contact. The first gate electrode is electrically connected to a second conductive line of the metal layer through a second contact and a second via over the second contact. The second logic cell includes a plurality of second transistors over the substrate. Each of the second transistors includes second source and drain regions extending from a second channel region and a second gate electrode across the second channel region. Each of the second source and drain regions is electrically connected to a third conductive line of the metal layer through a third contact and a third via over the third contact. The second gate electrode is electrically connected to a fourth conductive line of the metal layer directly through a fourth via. Projections of the second via and the first channel region are separated on the substrate, and projections of the fourth via and the second channel region are overlapped on the substrate.

In some embodiments, a semiconductor structure is provided. The semiconductor structure includes a logic cell and a memory cell. The logic cell includes a plurality of transistors. Each of the transistors includes a first gate electrode across a first semiconductor fin, and the first gate electrode is directly connected to a first conductive line of a metal layer through a first via. The memory cell includes a latch circuit formed by two cross-coupled inverters, and a pass-gate transistor coupling an output of the latch circuit to a bit line. The pass-gate transistor includes a second gate electrode across a second semiconductor fin. The second gate electrode is electrically connected to a word line through a first contact and a second via over the first contact. Projections of the second via and the second semiconductor fin are separated on the substrate, and projections of the first via and the first semiconductor fin are overlapped on the substrate.

In some embodiments, a semiconductor structure is provided. The semiconductor structure includes a first logic cell including a plurality of first transistors, a second logic cell including a plurality of second transistors, and a memory cell. Each of the first transistors includes first source and drain regions extending from a first semiconductor fin, and a first gate electrode across the first semiconductor fin. Each of the first source and drain regions is electrically connected to a first conductive line of a metal layer through a first contact and a first via over the first contact. The first gate electrode is electrically connected to a second conductive line of the metal layer through a second contact and a second via over the second contact. Each of the second transistors includes second source and drain regions extending from a second semiconductor fin, and a second gate electrode across the second semiconductor fin. Each of the second source and drain regions is electrically connected to a third conductive line of the metal layer through a third contact and a third via over the third contact. The second gate electrode is electrically connected to a fourth conductive line of the metal layer through a fourth via. The memory cell includes a latch circuit formed by two cross-coupled inverters, and a pass-gate transistor coupling an output of the latch circuit to a bit line. The pass-gate transistor includes a third gate electrode electrically connected to a word line through a fourth contact and a fifth via over the fourth contact. The first, second, third and fifth vias are formed in an inter-metallization dielectric (IMD) layer over an inter-layer dielectric (ILD) layer, and the fourth via is formed through the IMD layer and the ILD layer.

The foregoing outlines nodes of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a first logic cell comprising a plurality of first transistors over a substrate, wherein each of the first transistors comprises:
      first source and drain regions extending from a first channel region, wherein each of the first source and drain regions is electrically connected to a first conductive line of a metal layer through a first contact and a first via over the first contact; and
      a first gate electrode across the first channel region, wherein the first gate electrode is electrically connected to a second conductive line of the metal layer through a second contact and a second via over the second contact; and
   a second logic cell comprising a plurality of second transistors over the substrate, wherein each of the second transistors comprises:
      second source and drain regions extending from a second channel region, wherein each of the second source and drain regions is electrically connected to a third conductive line of the metal layer through a third contact and a third via over the third contact; and
      a second gate electrode across the second channel region, wherein the second gate electrode is electrically connected to a fourth conductive line of the metal layer directly through a fourth via,
   wherein projections of the second via and the first channel region are separated on the substrate, and projections of the fourth via and the second channel region are overlapped on the substrate,
   wherein the first transistors are surrounded by dummy gate electrodes, and the second transistors are surrounded by dummy gate dielectrics.

2. The semiconductor structure as claimed in claim 1, wherein dimension of the fourth via is at least 20% smaller than that of the first and third vias.

3. The semiconductor structure as claimed in claim 1, wherein the first, second, third, and fourth vias are formed of the same material comprising purely Tungsten (W) or purely Ruthenium (Ru) without a sidewall barrier layer.

4. The semiconductor structure as claimed in claim 1, wherein the first, second, third and fourth vias are formed of the same material selected from a group consisting of Ti, TiN, TaN, Co, Ru, Pt, W, Al, Cu or a combination thereof.

5. The semiconductor structure as claimed in claim 1, wherein the first, second and third contacts are formed of the same material selected from a group consisting of Ti, TiN, TaN, Co, Ru, Pt, W, Al, Cu or a combination thereof.

6. The semiconductor structure as claimed in claim 1, wherein the first and second contacts are slot-shaped contacts comprising a metal plug surrounded by a high-K dielectric.

7. The semiconductor structure as claimed in claim 6, wherein thickness of the high-K dielectric is within a range of 5 to 50 Å, and material of the high-K dielectric is selected from a group consisting of a nitride-based dielectric, a metal oxide dielectric, Hf oxide (HfO2), Ta oxide (Ta2O5), Ti oxide (TiO2), Zr oxide (ZrO2), Al oxide (Al2O3), Y oxide (Y2O3), or a combination thereof.

8. The semiconductor structure as claimed in claim 1, wherein dimension of the fourth via is smaller than that of the first and third vias.

9. A semiconductor structure, comprising:
a logic cell comprising a plurality of transistors, wherein each of the transistors comprises:
a first gate electrode across a first semiconductor fin, wherein the first gate electrode is directly connected to a first conductive line of a metal layer through a first via; and
a memory cell, comprising:
a latch circuit formed by two cross-coupled inverters; and
a pass-gate transistor coupling an output of the latch circuit to a bit line, comprising:
a second gate electrode across a second semiconductor fin, wherein the second gate electrode is electrically connected to a word line through a first contact and a second via over the first contact,
wherein projections of the second via and the second semiconductor fin are separated on the substrate, and projections of the first via and the first semiconductor fin are overlapped on the substrate,
wherein dimension of the first via is smaller than those of the second via.

10. The semiconductor structure as claimed in claim 9, wherein the first and second vias are formed of the same material comprising purely Tungsten (W) or purely Ruthenium (Ru) without a sidewall barrier layer.

11. The semiconductor structure as claimed in claim 9, wherein the first and second vias are formed of the same material selected from a group consisting of Ti, TiN, TaN, Co, Ru, Pt, W, Al, Cu or a combination thereof.

12. The semiconductor structure as claimed in claim 9, wherein the transistors of the logic cell are surrounded by dummy gate dielectrics located upon the edge of the first semiconductor fin.

13. The semiconductor structure as claimed in claim 9, wherein the first contact is formed of the same material selected from a group consisting of Ti, TiN, TaN, Co, Ru, Pt, W, Al, Cu or a combination thereof.

14. A semiconductor structure, comprising:
a first logic cell comprising a plurality of first transistors, wherein each of the first transistors comprises:
first source and drain regions extending from a first semiconductor fin, wherein each of the first source and drain regions is electrically connected to a first conductive line of a metal layer through a first contact and a first via over the first contact; and
a first gate electrode across the first semiconductor fin, wherein the first gate electrode is electrically connected to a second conductive line of the metal layer through a second contact and a second via over the second contact;
a second logic cell comprising a plurality of second transistors, wherein each of the second transistors comprises:
second source and drain regions extending from a second semiconductor fin, wherein each of the second source and drain regions is electrically connected to a third conductive line of the metal layer through a third contact and a third via over the third contact; and
a second gate electrode across the second semiconductor fin, wherein the second gate electrode is electrically connected to a fourth conductive line of the metal layer through a fourth via; and
a memory cell, comprising:
a latch circuit formed by two cross-coupled inverters; and
a pass-gate transistor coupling an output of the latch circuit to a bit line, comprising:
a third gate electrode electrically connected to a word line through a fourth contact and a fifth via over the fourth contact,
wherein the first, second, third and fifth vias are formed in an inter-metallization dielectric (IMD) layer over an inter-layer dielectric (ILD) layer, and the fourth via is formed through the IMD layer and the ILD layer,
wherein dimension of the fourth via is smaller than those of the first, second, third or fifth via.

15. The semiconductor structure as claimed in claim 14, wherein the first, second, third, fourth and fifth vias are formed of the same material comprising purely Tungsten (W) or purely Ruthenium (Ru) without a sidewall barrier layer.

16. The semiconductor structure as claimed in claim 14, wherein the first, second, third, fourth and fifth vias are formed of the same material selected from a group consisting of Ti, TiN, TaN, Co, Ru, Pt, W, Al, Cu, or a combination thereof.

17. The semiconductor structure as claimed in claim 14, wherein the first, second, third and fourth contacts are formed of the same material selected from a group consisting of Ti, TiN, TaN, Co, Ru, Pt, W, Al, Cu, or a combination thereof.

18. The semiconductor structure as claimed in claim 14, wherein the first, second, third and fourth contacts are slot-shaped contacts comprising a metal plug surrounded by a high-K dielectric.

19. The semiconductor structure as claimed in claim 14, wherein the first transistors are surrounded by dummy gate electrodes located upon the edge of the first semiconductor fin, and the second transistors are surrounded by dummy gate dielectrics located upon the edge of the second semiconductor fin.

20. The semiconductor structure as claimed in claim 14, wherein dimension of the fourth via is at least 20% smaller than that of the first and third vias.

* * * * *